United States Patent
Huang et al.

(10) Patent No.: US 11,031,326 B2
(45) Date of Patent: Jun. 8, 2021

(54) WIRING STRUCTURE, ELECTRONIC DEVICE AND METHOD FOR MANUFACTURING THE SAME

(71) Applicant: Advanced Semiconductor Engineering, Inc., Kaohsiung (TW)

(72) Inventors: Wen Hung Huang, Kaohsiung (TW); Chien-Mei Huang, Kaohsiung (TW); Yan Wen Chung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/802,478

(22) Filed: Feb. 26, 2020

(65) Prior Publication Data
US 2020/0194361 A1      Jun. 18, 2020

Related U.S. Application Data

(63) Continuation of application No. 15/974,419, filed on May 8, 2018, now Pat. No. 10,643,937.

(51) Int. Cl.
| | | |
|---|---|---|
| *H01L 25/065* | (2006.01) | |
| *H01L 23/498* | (2006.01) | |
| *H01L 23/00* | (2006.01) | |
| *H01L 21/48* | (2006.01) | |

(52) U.S. Cl.
CPC ...... *H01L 23/49822* (2013.01); *H01L 21/486* (2013.01); *H01L 23/49866* (2013.01); *H01L 24/03* (2013.01); *H01L 24/08* (2013.01); *H01L 2224/02373* (2013.01);

(Continued)

(58) Field of Classification Search
CPC ............................. H01L 24/13; H01L 25/0657
See application file for complete search history.

(56) References Cited

U.S. PATENT DOCUMENTS

| | | | |
|---|---|---|---|
| 2007/0025079 A1 | 2/2007 | Salmon | |
| 2013/0075905 A1* | 3/2013 | Choi | ................... H01L 25/0657 257/738 |
| 2013/0087914 A1 | 4/2013 | Yang et al. | |

FOREIGN PATENT DOCUMENTS

| | | |
|---|---|---|
| CN | 103035579 A | 4/2013 |
| KR | 10-0378095 B1 | 3/2003 |

OTHER PUBLICATIONS

Non-Final Office Action for U.S. Appl. No. 15/974,419, dated Jul. 5, 2019, 9 pages.

(Continued)

*Primary Examiner* — Thomas L Dickey
(74) *Attorney, Agent, or Firm* — Foley & Lardner LLP

(57) ABSTRACT

A wiring structure includes an insulating layer and a conductive structure. The insulating layer has an upper surface and a lower surface opposite to the upper surface, and defines an opening extending through the insulating layer. The conductive structure is disposed in the opening of the insulating layer, and includes a first barrier layer and a wetting layer. The first barrier layer is disposed on a sidewall of the opening of the insulating layer, and defines a through hole extending through the first barrier layer. The wetting layer is disposed on the first barrier layer. A portion of the wetting layer is exposed from the through hole of the first barrier layer and the lower surface of the insulating layer to form a ball pad.

16 Claims, 19 Drawing Sheets

(52) U.S. Cl.
CPC .................. *H01L 2224/0401* (2013.01); *H01L 2924/3511* (2013.01); *H01L 2924/35121* (2013.01)

(56) References Cited

OTHER PUBLICATIONS

Notice of Allowance for U.S. Appl. No. 15/974,419, dated Oct. 22, 2019, 8 pages.

\* cited by examiner though the first insulating layer. The conductive structure is disposed in the opening of the insulating layer, and includes a first barrier layer and a wetting layer. The first barrier layer is disposed on a sidewall of the opening of the insulating layer, and defines a through hole extending through the first barrier layer. The wetting layer is disposed on the first barrier layer. A portion of the wetting layer is exposed from the through hole of the first barrier layer and the lower surface of the insulating layer to form a ball pad.

WIRING STRUCTURE, ELECTRONIC DEVICE AND METHOD FOR MANUFACTURING THE SAME

CROSS REFERENCE TO RELATED APPLICATIONS

This application is a continuation of U.S. patent application Ser. No. 15/974,419, filed May 8, 2018, the contents of which are incorporated herein by reference in their entirety.

BACKGROUND

1. Field of the Disclosure

The present disclosure relates to a wiring structure, an electronic device and a manufacturing method, and to a wiring structure having a portion of a wetting layer exposed from a barrier layer to form a ball pad, an electronic device including the wiring structure, and a method for manufacturing the electronic device.

2. Description of the Related Art

In a package of radio frequency (RF) die, a redistribution layer (RDL) structure can be used to couple with the RF die. Due to impedance matching concerns, such RDL structure can be designed with a structure having five passivation layers and five metal layers (5P5M). A manufacturing process for a structure having one passivation layer and one metal layer (1P1M) can take about 10 days, and thus the manufacturing process for 5P5M structure can have a total manufacturing time of about 60 days. Thus, the manufacturing cost may be high. Further, such a 5P5M structure has a great thickness, which may readily cause warpage and/or delamination issues.

SUMMARY

In some embodiments, a wiring structure includes an insulating layer and a conductive structure. The insulating layer has an upper surface and a lower surface opposite to the upper surface, and defines an opening extending through the insulating layer. The conductive structure is disposed in the opening of the insulating layer, and includes a first barrier layer and a wetting layer. The first barrier layer is disposed on a sidewall of the opening of the insulating layer, and defines a through hole extending through the first barrier layer. The wetting layer is disposed on the first barrier layer. A portion of the wetting layer is exposed from the through hole of the first barrier layer and the lower surface of the insulating layer to form a ball pad.

In some embodiments, an electronic device includes a first insulating layer, a lower conductive structure and at least one electrical connecting element. The first insulating layer has an upper surface and a lower surface opposite to the upper surface, and defines a first opening extending through the first insulating layer. The lower conductive structure includes a lower circuit structure disposed in the first opening of the first insulating layer. The lower circuit structure includes a plurality of metal layers. The lower circuit structure includes a bonding region and an extending region. An amount of metal layers of the bonding region is different from an amount of metal layers of the extending region. The electrical connecting element is attached to the bonding region of the lower conductive structure.

In some embodiments, a method for manufacturing an electronic device includes: forming a first opening extending through a first insulating layer; forming a lower seed layer in the first opening and on the insulating layer; forming a first barrier layer, a wetting layer and a second barrier layer sequentially on the seed layer to form a lower circuit structure; etching a portion of the first barrier layer to expose a portion of the wetting layer; and attaching at least one electrical connecting element to the exposed portion of the wetting layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
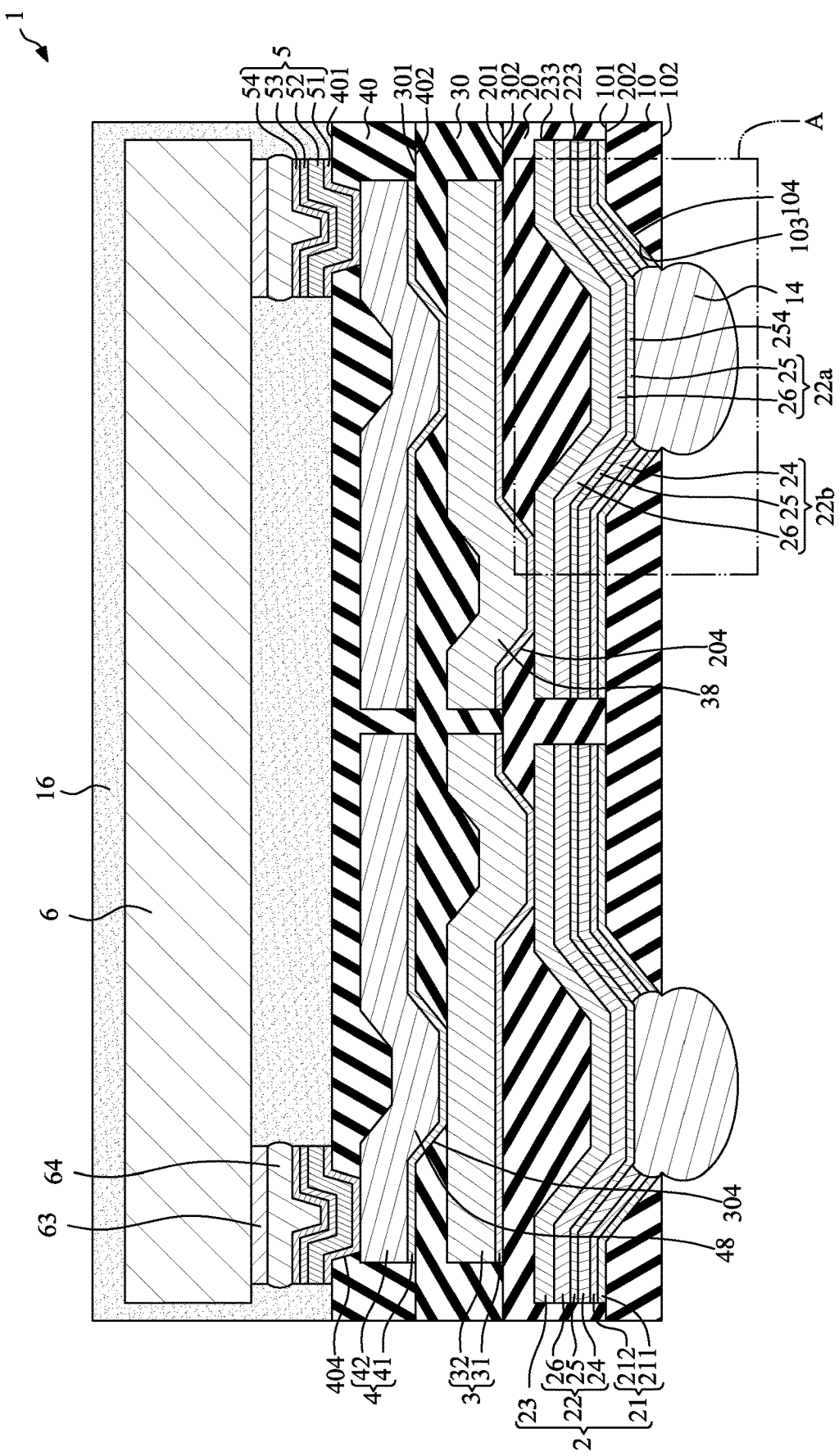
FIG. 1 illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a package including an RF die, an RDL structure can be used to couple with the RF die. Due to impedance matching concerns, such an RDL structure can be designed with a 5P5M structure. A comparative manufacturing process of such a 5P5M structure includes providing a carrier having a seed layer (or a release metal film) disposed thereon, forming a first passivation layer (P1) with a first through hole on the seed layer, forming a first metal layer (M1) on the P1 and in the first through hole, forming a second passivation layer (P2) with a second through hole on the P1 and covering the Ml, forming a second metal layer (M2) on the P2 and in the second through hole to electrically connect the Ml, and then sequentially forming a third passivation layer (P3), a third metal layer (M3), a fourth passivation layer (P4), a fourth metal layer (M4), a fifth passivation layer (P5) and a fifth metal layer (M5) in a similar manner.

The M1 merely serves for external connection purpose. A portion of the M1 in the first through hole extends through the P1 and is exposed from the P1 to form a ball pad. An area of the first through hole may be slightly larger than an area of the second through hole, and the second through hole is disposed directly above the first through hole. A portion of the M2 in the second through hole of the P2 forms a conductive via, which is disposed on the ball pad of the Ml, forming a "via-on-via structure." The unflat structure of the P1 and the M1 around the first through hole may result in insufficient exposure and development of a photoresist for forming the conductive via of the M2. Thus, the yield rate of the RDL structure is low. Similarly, the M5 is an under bump metallization (UBM) merely serving for external connections.

After formation of the 5P5M structure, at least one semiconductor die is attached to the 5P5M structure, and an encapsulant is applied to cover the semiconductor die and the 5P5M structure. Then, the carrier is removed, and the seed layer (or the release metal film) is removed by etching. The portion of the M1 in the first through hole of the P1 is exposed from the P1 to form the ball pad, and an electrical connecting element is connected thereto for external connections. Then, a singulation process is conducted to form a plurality of separate package structures.

During the manufacturing process of such 5P5M structure, each of the five metal layers may be formed with a distinct patterned photoresist corresponding to the layout thereof, and thus the manufacturing process of such 5P5M structure uses five different photomasks. In addition, formation of a passivation layer and a metal layer can take about 10 days, and thus formation of 5P5M structure can have a total manufacture time of about 60 days. Thus, the manufacturing cost can be high. Further, such a 5P5M structure has a great thickness, which may readily cause warpage and delamination issues. Usually, one passivation layer can increase a warpage of about 100 μm to about 500 μm.

As described above, the ball pad is formed by the M1, and a material thereof is copper. The electrical connecting element connected to the ball pad may be made of a solder ball (e.g., by solder ball mounting process) or a solder paste (e.g., by solder paste printing process). A size of the solder ball may be smaller than a size of the solder paste. However, since the solder ball is mainly composed of tin, an intermetallic compound (IMC) may be readily formed at the solder joint boundary between the ball pad (made of copper) and the electrical connecting element (made of tin). Such IMC may decrease bonding strength between the ball pad and the solder ball. An increased thickness of the M1 (e.g., greater than 8 μm) may compensate the effect of the IMC, but a total thickness of the package is correspondingly increased. Besides, with the increased thickness, a gap between an extending portion of the M1 disposed on the P1 and the M2 is reduced, thus may readily cause a short circuit between the extending portion of the M1 and the M2. Such short circuit may be avoided by decreasing an area of the extending portion of the M1 disposed on the P1. However, the extending portion of the M1 with the decreased area cannot provide sufficient support for the ball pad. When the electrical connecting element is connected to the ball pad, the weight of the electrical connecting element may cause delamination of the M1.

On the other hand, a material of the solder paste includes a fraction of tin less than that of a solder ball, thus can prevent IMC formed between the ball pad and the electrical connecting element. However, a solder paste printing process can be constrained to form an electrical connecting element with a size of greater than 250 μm*250 μm (since the size of the opening of a screen printing plate is greater than 250 μm*250 μm). Hence, a size of the ball pad should correspondingly increase, which adversely affects the layout of the package.

The present disclosure addresses at least some of the above concerns and provides for an improved wiring structure, an improved electronic device, and improved techniques for manufacturing the electronic device. In the electronic device and similarly in the wiring structure, an RDL (e.g., M2) is directly disposed on a circuit structure (e.g., M1) to form a conductive structure, and a portion of the circuit structure is exposed from an insulating layer (P1) for external connections. The RDL and the circuit structure are combined in the conductive structure and can be formed by using a same photomask and/or a same patterned photoresist. An insulating layer (e.g., P2) therebetween can be omitted. Thus, the cost of the manufacturing process is reduced.

FIG. 1 illustrates a cross-sectional view of an electronic device 1 according to some embodiments of the present disclosure. The electronic device 1 includes a first insulating layer 10, a lower conductive structure 2, at least one intermediate conductive structure 3, an upper conductive structure 4, a plurality of insulating layers (e.g., a second insulating layer 20, a third insulating layer 30 and a fourth insulating layer 40), an under bump metallization (UBM) 5, at least one semiconductor die 6, an encapsulant 16, and at least one electrical connecting element 14.

The first insulating layer 10 has an upper surface 101 and a lower surface 102 opposite to the upper surface 101. The first insulating layer 10 defines a first opening 104 extending through the first insulating layer 10. The first opening 104 has a sidewall 103. A material of the first insulating layer 10 may include an insulating material, a passivation material, a dielectric material or a solder resist material, such as, for example, a benzocyclobutene (BCB) based polymer or a polyimide (PI). In some embodiments, the first insulating layer 10 may include a cured photoimageable dielectric (PID) material, such as an epoxy or a PI including photoinitiators. A thickness of the first insulating layer 10 may be about 7 μm.

The lower conductive structure 2 is disposed on the upper surface 101 of the first insulating layer 10 and in the first opening 104 of the first insulating layer 10. The lower conductive structure 2 includes a lower seed layer 21, a lower circuit structure 22 and a lower redistribution layer (RDL) 23 sequentially disposed on the first insulating layer 10.

The lower seed layer 21 is disposed on the upper surface 101 of the first insulating layer 10, and on the sidewall 103 of the first opening 104 of the first insulating layer 10. The lower seed layer 21 is interposed between the first insulating layer 10 and the lower circuit structure 22. In some embodiments, the lower seed layer 21 is not exposed from the lower surface 102 of the first insulating layer 10. That is, a portion of the lower seed layer 21 adjacent to the lower surface 102 of the insulating layer 10 is removed or omitted. A material of the lower seed layer 21 may be titanium, copper, another metal or an alloy. In some embodiments, as shown in FIG. 1, the lower seed layer 21 includes a titanium layer 211 and a copper layer 212. However, the lower seed layer 21 may include more or less layers, or may be omitted. The titanium layer 211 is disposed on and contacts the upper surface 101 of the first insulating layer 10 and the sidewall 103 of the first opening 104 of the first insulating layer 10. The copper layer 212 is disposed on and contacts the titanium layer 211. A thickness of the titanium layer 211 may be about 0.1 μm, and a thickness of the copper layer 212 may be about 0.2 μm.

The lower circuit structure 22 is disposed on the upper surface 101 of the first insulating layer 10, and in the first opening 104 of the first insulating layer 10. As shown in FIG. 1, the lower circuit structure 22 is disposed on and completely covers the lower seed layer 21. The lower circuit structure 22 may contact the lower seed layer 21.

The lower circuit structure 22 includes a plurality of metal layers (e.g., a first barrier layer 24, a wetting layer 25 and a second barrier layer 26). The first barrier layer 24, the wetting layer 25 and the second barrier layer 26 are sequentially disposed on the lower seed layer 21. The first barrier layer 24 is disposed on the upper surface 101 of the first insulating layer 10, and on the sidewall 103 of the first opening 104 of the first insulating layer 10. The first barrier layer 24 is disposed on the lower seed layer 21, and may contact and completely covers the lower seed layer 21, such as the copper layer 212 of the lower seed layer 21. In some embodiments, the first barrier layer 24 is not exposed from the lower surface 102 of the first insulating layer 10. That is, a portion of the first barrier layer 24 adjacent to the lower surface 102 of the insulating layer 10 is removed or omitted.

The wetting layer 25 is disposed on the upper surface 101 of the first insulating layer 10, and in the first opening 104 of the first insulating 10. The wetting layer 25 is disposed on the first barrier layer 24, and may contact and completely cover the first barrier layer 24. Since the portions of the lower seed layer 21 and the first barrier layer 24 adjacent to the lower surface 102 of the insulating layer 10 is removed or omitted, a portion 254 of the wetting layer 25 is exposed from the lower seed layer 21 and the first barrier layer 24, and from the lower surface 102 of the first insulating layer 10. The exposed portion 254 of the wetting layer 25 forms a ball pad for external connections.

The second barrier layer 26 is disposed on the upper surface 101 of the first insulating layer 10, and in the first opening 104 of the first insulating 10. The second barrier layer 26 is disposed on the wetting layer 25, and may contact and completely cover the wetting layer 25.

The lower circuit structure 22 includes a bonding region 22a and an extending region 22b. In some embodiments, each layer of the lower circuit structure 22 within the bonding region 22a and within the extending region 22b may be formed concurrently and integrally as a monolithic structure. The bonding region 22a is exposed from the lower surface 102 of the first insulating layer 10 and includes the exposed portion 254 of the wetting layer 25 as the ball pad for external connections. As shown in FIG. 1, since the portion of the first barrier layer 24 adjacent to the lower surface 102 of the insulating layer 10 is removed or omitted, the bonding region 22a includes or is composed of two metal layers, i.e., the wetting layer 25 and the second barrier layer 26. Since the bonding region 22a does not include the first barrier layer 24, the bonding region 22a is recessed from the lower surface 102 of the first insulating layer 10.

The extending region 22b is connected to and extends from the bonding region 22a. The extending region 22b is disposed on the sidewall 103 of the first opening 104 of the first insulating layer 10, and on the upper surface 101 of the first insulating layer 10. As shown in FIG. 1, the extending region 22b includes or is composed of three layers, i.e., the first barrier layer 24, the wetting layer 25 and the second barrier layer 26. Accordingly, an amount of metal layers of the bonding region 22a is different from an amount of metal layers of the extending region 22b.

A material of the first barrier layer 24 and the second barrier layer 26 may include nickel. A material of the wetting layer 25 may include gold. A thickness of the first barrier layer 24 may be about 1 μm, a thickness of the wetting layer 25 may be about 0.3 μm, and a thickness of the second barrier layer 26 may be about 3 μm. In some embodiments, the first barrier layer 24, the wetting layer 25 and the second barrier layer 26 may be formed by plating using a same photomask and/or a same patterned photoresist. Thus, a peripheral wall 223 of the lower circuit structure 22, including the first barrier layer 24, the wetting layer 25 and the second barrier layer 26, is continuous. That is, the peripheral walls of the first barrier layer 24, the wetting layer 25 and the second barrier layer 26 are coplanar with one another.

The lower RDL 23 is disposed on the upper surface 101 of the first insulating layer 10, and in the first opening 104 of the first insulating 10. The lower RDL 23 is disposed on the lower circuit structure 22, and may contact and completely cover the lower circuit structure 22, such as the second barrier layer 26 of the lower circuit structure 22. The lower RDL 23 may include at least one pad and at least one trace. A material of the lower RDL 23 may include, for example, copper, another conductive metal, or an alloy thereof. A thickness of the lower RDL 23 may be about 4.3 μm. The lower RDL 23 may be formed by plating using the same photomask and/or the same patterned photoresist as the lower circuit structure 22. Hence, a peripheral wall 233 of the lower RDL 23 may align with the peripheral wall 223 of the lower circuit structure 22. That is, the peripheral wall 233 of the lower RDL 23 may be coplanar with the peripheral wall 223 of the lower circuit structure 22. The lower RDL 23 may be conformal with the lower circuit structure 22. A layout of the lower RDL 23 may be substantially the same as a layout of the lower circuit structure 22.

The second insulating layer 20 covers at least portions of the first insulating layer 10 and the lower conductive structure 2. As shown in FIG. 1, the second insulating layer 20 is disposed on the upper surface 101 of the first insulating layer 10. The second insulating layer 20 has an upper surface 201 and a lower surface 202 opposite to the upper surface 201. The second insulating layer 20 defines a second opening 204 extending through the second insulating layer 20 to expose a portion of the lower RDL 23 of the lower conductive structure 2. A material of the second insulating layer 20 may include an insulating material, a passivation material, a dielectric material or a solder resist material, such as, for example, a benzocyclobutene (BCB) based polymer or a polyimide (PI). In some embodiments, the second insulating layer 20 may include a cured photoimageable dielectric (PID) material, such as an epoxy or a PI including photoinitiators. A thickness of the second insulating layer 20 may be about 9 μm.

The intermediate conductive structure 3 is disposed between the upper conductive structure 4 and the lower conductive structure 2. As shown in FIG. 1, the intermediate conductive structure 3 is disposed on the upper surface 201 of the second insulating layer 20. FIG. 1 shows one intermediate conductive structure 3. However, the electronic device 1 may include more than one intermediate conductive structure 3. The intermediate conductive structure 3 extends into the second opening 204 of the second insulating layer 20 to form a conductive via 38. That is, the conductive via 38 of the intermediate conductive structure 3 extends through the second insulating layer 20. The intermediate conductive structure 3 is electrically connected to the lower conductive structure 2 through the conductive via 38.

The intermediate conductive structure 3 includes an intermediate seed layer 31 and an intermediate RDL 32 sequentially disposed on the second insulating layer 20. A material of the intermediate seed layer 31 may be titanium, copper, another metal or an alloy. FIG. 1 shows the intermediate seed layer 31 composed of only or at least primarily of one layer. However, the intermediate seed layer 31 may include more than one layers, or may be omitted. The intermediate RDL 32 is disposed on and completely covers the intermediate seed layer 31. The intermediate RDL 32 may include at least one pad and at least one trace. A material of the intermediate RDL 32 may include, for example, copper, another conductive metal, or an alloy thereof. A thickness of the intermediate RDL 32 may be about 8 μm.

The third insulating layer 30 covers at least portions of the second insulating layer 20 and the intermediated conductive structure 3. As shown in FIG. 1, the third insulating layer 30 is disposed on the upper surface 201 of the second insulating layer 20. The third insulating layer 30 has an upper surface 301 and a lower surface 302 opposite to the upper surface 301. The third insulating layer 30 defines a third opening 304 extending through the third insulating layer 30 to expose a portion of the intermediate RDL 32. A material of the third insulating layer 30 may include an insulating material, a passivation material, a dielectric material or a solder resist material, such as, for example, a benzocyclobutene (BCB) based polymer or a polyimide (PI). In some embodiments, the third insulating layer 30 may include a cured photoimageable dielectric (PID) material, such as an epoxy or a PI including photoinitiators. A thickness of the third insulating layer 30 may be about 9 μm.

The upper conductive structure 4 is disposed on the upper surface 301 of the third insulating layer 30. As shown in FIG. 1, the upper conductive structure 4 is disposed on the upper surface 301 of the third insulating layer 30. The upper conductive structure 4 extends into the third opening 304 of the third insulating layer 30 to form a conductive via 48.

That is, the conductive via 48 of the upper conductive structure 4 extends through the third insulating layer 30. The upper conductive structure 4 is electrically connected to the intermediate conductive structure 3 through the conductive via 48. Hence, the upper conductive structure 4 is electrically connected to the lower conductive structure 2 through the intermediate conductive structure 3.

The upper conductive structure 4 includes an upper seed layer 41 and an upper RDL 42 sequentially disposed on the third insulating layer 30. A material of the upper seed layer 41 may be titanium, copper, another metal or an alloy. FIG. 1 shows the upper seed layer 41 composed of only or at least primarily of one layer. However, the upper seed layer 41 may include more than one layers, or may be omitted. The upper RDL 42 is disposed on and completely covers the upper seed layer 41. The upper RDL 42 may include at least one pad and at least one trace. A material of the upper RDL 42 may include, for example, copper, another conductive metal, or an alloy thereof. A thickness of the upper RDL 42 may be about 8 μm.

The fourth insulating layer 40 covers at least portions of the third insulating layer 30 and the upper conductive structure 4. As shown in FIG. 1, the fourth insulating layer 40 is disposed on the upper surface 301 of the third insulating layer 30. The fourth insulating layer 40 has an upper surface 401 and a lower surface 402 opposite to the upper surface 401. The fourth insulating layer 40 defines a fourth opening 404 extending through the fourth insulating layer 40 to expose a portion of the upper RDL 42 of the upper conductive structure 4. A material of the fourth insulating layer 40 may include an insulating material, a passivation material, a dielectric material or a solder resist material, such as, for example, a benzocyclobutene (BCB) based polymer or a polyimide (PI). In some embodiments, the fourth insulating layer 40 may include a cured photoimageable dielectric (PID) material, such as an epoxy or a PI including photoinitiators. A thickness of the fourth insulating layer 40 may be about 9 μm.

The UBM 5 is electrically connected to the upper conductive structure 4, such as the upper RDL 42 of the conductive structure 4. As shown in FIG. 1, the UBM 5 is disposed in the fourth opening 404 of the fourth insulating layer 40, and a portion of the UBM 5 may extend on the upper surface 401 of the fourth insulating layer 40. As shown in FIG. 1, the UBM 5 includes a UBM seed layer 51, a copper layer 52, a nickel layer 53 and a gold layer 54 sequentially disposed in the fourth opening 404. A material of the UBM seed layer 51 may be titanium, copper, another metal or an alloy.

The semiconductor die 6 is electrically connected to the upper conductive structure 4 through the UBM 5. For example, the semiconductor die 6 includes at least one bump pad 63 and at least one interconnecting element 64. The bump pad 63 is disposed on the semiconductor die 6, and the interconnecting element 64 is disposed on the UBM 5 and connected to the bump pad 63. In some embodiments, the interconnecting element 64 may be formed of a pre-solder or a solder ball.

The encapsulant 16 is disposed on the fourth insulating layer 40, and encapsulates and covers the semiconductor die 6, the bump pad 63, the interconnecting element 64 and the UBM 5. A material of the encapsulant 16 may be a molding compound with or without fillers.

The electrical connecting element 14 is attached to the bonding region 22*a* of the lower conductive structure 22 for external connections. As shown in FIG. 1, the electrical connecting element 14 is attached to the ball pad formed by the exposed portion 254 of the wetting layer 25. The electrical connecting element 14 may be formed of a solder ball. In some embodiments, a maximum width or diameter of the electrical connecting element 14 may be about 80 μm, or less. Correspondingly, a width or diameter of the ball pad formed by the exposed portion 254 of the wetting layer 25 (i.e., a width or diameter of the bonding region 22*a* of the lower circuit structure 22) may be about 80 μm*80 μm. In some embodiments, the electrical connecting element 14 is connected to a mother board.

In the electronic device 1, since the lower RDL 23 is directly disposed on the lower circuit structure 22 rather than being disposed on the lower circuit structure 22 via another conductive metal layer, an additional conductive metal layer can be omitted. Further, an additional insulating layer can also be omitted since there is no insulating layer needed between the lower RDL 23 and the lower circuit structure 22. The electronic device 1 includes four conductive metal layers (i.e., the lower conductive structure 2, the intermediate conductive structure 3, the upper conductive structure 4 and the UBM 5) and four insulating layers (i.e., the first insulating layer 10, the second insulating layer 20, the third insulating layer 30 and the fourth insulating layer 40) rather than five conductive metal layers and five insulating layers. Thus, the formation time and the manufacturing cost of the electronic device 1 can be reduced. A total thickness of the electronic device 1 is also reduced, avoiding warpage and delamination issues. Besides, the lower RDL 23 and the lower circuit structure 22 can be formed by using a same photomask and/or a same patterned photoresist, which further reduces the formation time and the manufacturing cost of the electronic device 1.

Furthermore, since the first barrier layer 24 is omitted in the bonding region 22*a* (i.e., the portion 254 of the wetting layer 25 is exposed from the first barrier layer 24 as the ball pad), the electrical connecting element 14 can be formed of a solder ball rather than a solder paste. That is, the wetting layer 25 can prevent formation of IMC between the solder ball (e.g., made of tin) and the wetting layer 25 (e.g., made of gold). The size of the ball pad of the electronic device 1 can thus be reduced to about 80 μm*80 μm, which is much smaller than a ball pad with an electrical connecting element made of a solder paste as described above. A total thickness of the lower circuit structure 22 in the electronic device 1 is about 4.3 μm, which is smaller than a thickness of a ball pad made of copper (e.g., about 8 μm) described above. Such reduced thickness of the lower circuit structure 22 is beneficial for reducing the total thickness of the electronic device 1 and for preventing short circuit between the lower conductive structure 2 and the intermediate conductive structure 3.

Since the lower circuit structure 22 has the same layout as the lower RDL 23, an area of the extending region 22*b* of the lower circuit structure 22 disposed on the upper surface 101 of the first insulating layer 10 has an enlarged area. The extending region 22*b* of the lower circuit structure 22 can thus provide sufficient support for the bonding region 22*a* of the lower circuit structure 22, preventing delamination caused by the weight of the electrical connecting element 14 connected to the bonding region 22*a*. Besides, since the bonding region 22*a* is recessed from the lower surface 102 of the first insulating layer 10, a contact area between the electrical connecting element 14 and the lower conductive structure 2 is increased, thus improving bonding strength therebetween.

Since the lower seed layer 21 (e.g., the copper layer 212 of the lower seed layer 21) is made of copper and the wetting layer 25 is made of gold, an IMC may occur when the lower seed layer 21 directly contacts the wetting layer 25. However, the first barrier layer 24 disposed therebetween can prevent such IMC. Similarly, concerning the wetting layer 25 made of gold and the lower RDL 23 made of copper, the second barrier layer 26 disposed therebetween can prevent an IMC which may occur when the wetting layer 25 directly contacts the lower RDL 23.

Figure 2:
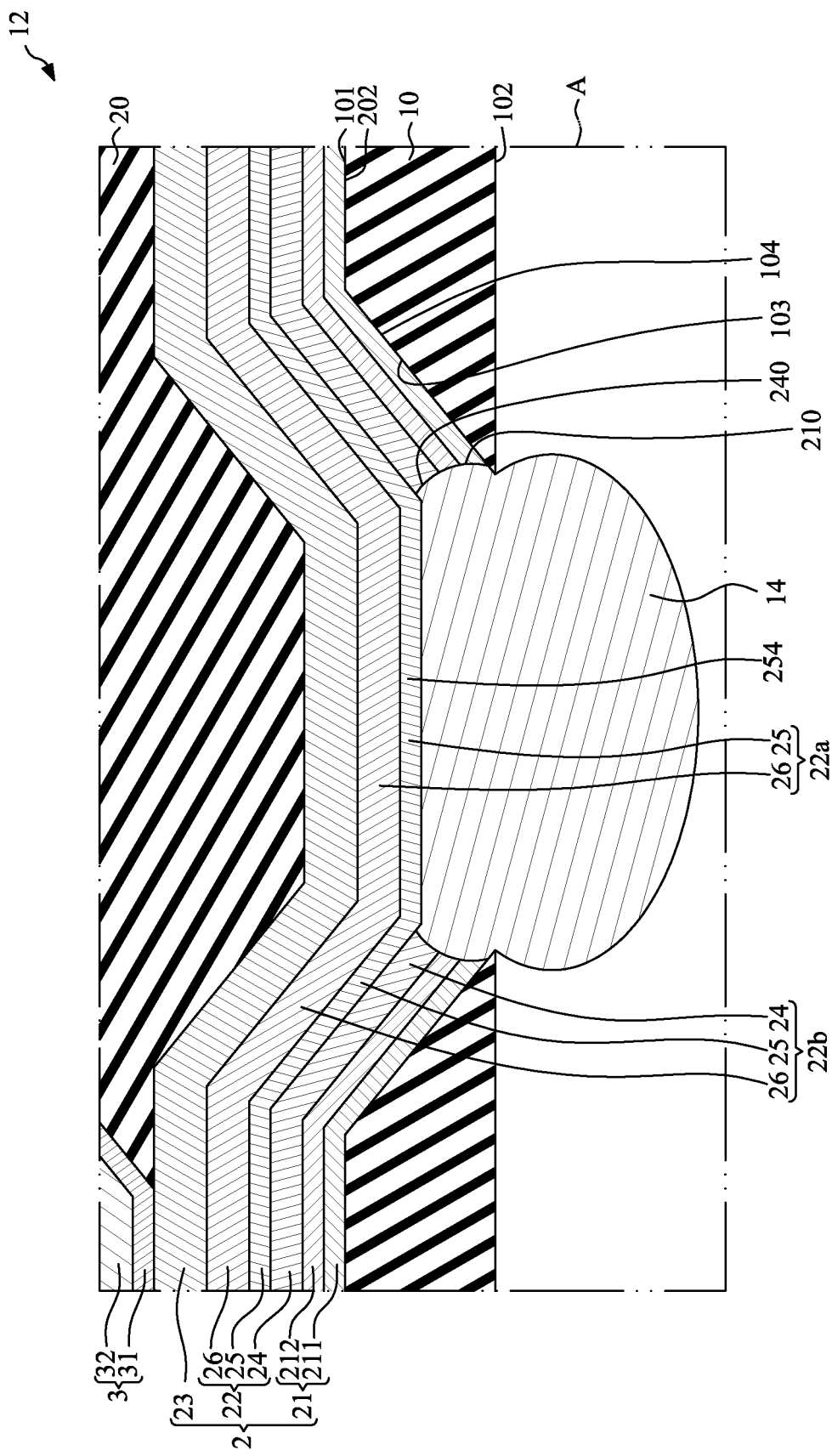
FIG. 2 illustrates an enlarged view of an area "A" shown in FIG. 1.

FIG. 2 illustrates an enlarged view of an area "A" shown in FIG. 1. It is noted that FIG. 2 shows a wiring structure 12 that is included in the electronic device 1 according to some embodiments of the present disclosure.

The wiring structure 12 includes an insulating layer (e.g., the first insulating layer 10) and a conductive structure (e.g., the lower conductive structure 2).

The first insulating layer 10 has the upper surface 101 and the lower surface 102 opposite to the upper surface 101. The first insulating layer 10 defines an opening (e.g., the first opening 104) extending through the first insulating layer 10. The first opening 104 has a sidewall 103. The lower conductive structure 2 is disposed on the upper surface 101 of the first insulating layer 10 and in the first opening 104 of the first insulating layer 10. The lower conductive structure 2 includes the lower seed layer 21, the lower circuit structure 22 and the lower redistribution layer (RDL) 23 sequentially disposed on the first insulating layer 10.

The lower seed layer 21 is disposed on the upper surface 101 of the first insulating layer 10, and on the sidewall 103 of the first opening 104 of the first insulating layer 10. The lower seed layer 21 is interposed between the first insulating layer 10 and the lower conductive structure 22. In some embodiments, the lower seed layer 21 is not exposed from the lower surface 102 of the first insulating layer 10. That is, a portion of the lower seed layer 21 adjacent to the lower surface 102 of the insulating layer 10 is removed or omitted. Accordingly, the lower seed layer 21 defines a through hole 210 extending through the seed layer 21. The through hole 210 of the lower seed layer 21 is located at the opening 104 of the first insulating layer 10. A central axial of the through hole 210 of the lower seed layer 21 aligns with a central axial of the opening 104 of the insulating layer 10. A material of the lower seed layer 21 may be titanium, copper, another metal or an alloy. In some embodiments, as shown in FIG. 2, the lower seed layer 21 includes a titanium layer 211 and a copper layer 212. However, the lower seed layer 21 may include more or less layers, or may be omitted. The titanium layer 211 is disposed on and contacts the upper surface 101 of the first insulating layer 10 and the sidewall 103 of the first opening 104 of the first insulating layer 10. The copper layer 212 is disposed on and contacts the titanium layer 211.

The lower circuit structure 22 is disposed on the upper surface 101 of the first insulating layer 10, and in the first opening 104 of the first insulating layer 10. As shown in FIG. 2, the lower circuit structure 22 is disposed on and completely covers the lower seed layer 21. The lower circuit structure 22 may contact the lower seed layer 21.

The lower circuit structure 22 includes a plurality of metal layers (e.g., a first barrier layer 24, a wetting layer 25 and a second barrier layer 26). The first barrier layer 24, the wetting layer 25 and the second barrier layer 26 are sequentially disposed on the lower seed layer 21. The first barrier layer 24 is disposed on the upper surface 101 of the first insulating layer 10, and on the sidewall 103 of the first opening 104 of the first insulating layer 10. The first barrier layer 24 is disposed on the lower seed layer 21, and may contact and completely covers the lower seed layer 21, such as the copper layer 212 of the lower seed layer 21. In some embodiments, the first barrier layer 24 is not exposed from the lower surface 102 of the first insulating layer 10. That is, a portion of the first barrier layer 24 adjacent to the lower surface 102 of the insulating layer 10 is removed or omitted. Accordingly, the first barrier layer 24 defines a through hole 240 extending through the first barrier layer 24. The through hole 240 of the first barrier layer 24 may substantially align and communicate with the through hole 210 of the seed layer 21.

The wetting layer 25 is disposed on the upper surface 101 of the first insulating layer 10, and in the first opening 104 of the first insulating 10. The wetting layer 25 is disposed on the first barrier layer 24, may contact and completely cover the first barrier layer 24. Since the portions of the lower seed layer 21 and the first barrier layer 24 adjacent to the lower surface 102 of the insulating layer 10 is removed or omitted, a portion 254 of the wetting layer 25 is exposed from the lower seed layer 21 and the first barrier layer 24, and from the lower surface 102 of the first insulating layer 10. That is, the portion 254 of the wetting layer 25 is exposed from the through hole 210 of the lower seed layer 21 and the through hole 240 the first barrier layer 24, and is exposed form the lower surface 102 of the first insulating layer 10. The exposed portion 254 of the wetting layer 25 forms a ball pad for external connections.

The second barrier layer 26 is disposed on the upper surface 101 of the first insulating layer 10, and in the first opening 104 of the first insulating 10. The second barrier layer 26 is disposed on the wetting layer 25, and may contact the wetting layer 25. A material of the first barrier layer 24 and the second barrier layer 26 may include nickel. A material of the wetting layer 25 may include gold.

The lower circuit structure 22 includes the bonding region 22a and the extending region 22b. The bonding region 22a is exposed from the first opening 104 of the first insulating layer 10 and includes the exposed portion 254 of the wetting layer 25 and the second barrier layer 26. The extending region 22b is connected to and extends from the bonding region 22a. The extending region 22b is disposed on the sidewall 103 of the first opening 104 of the first insulating layer 10, and on the upper surface 101 of the first insulating layer 10.

The lower RDL 23 is disposed on the upper surface 101 of the first insulating layer 10, and in the first opening 104 of the first insulating 10. The lower RDL 23 is disposed on the lower circuit structure 22, and may contact and completely cover the lower circuit structure 22, such as the second barrier layer 26 of the lower circuit structure 22. A material of the lower RDL 23 may include, for example, copper, another conductive metal, or an alloy thereof.

Figure 3:
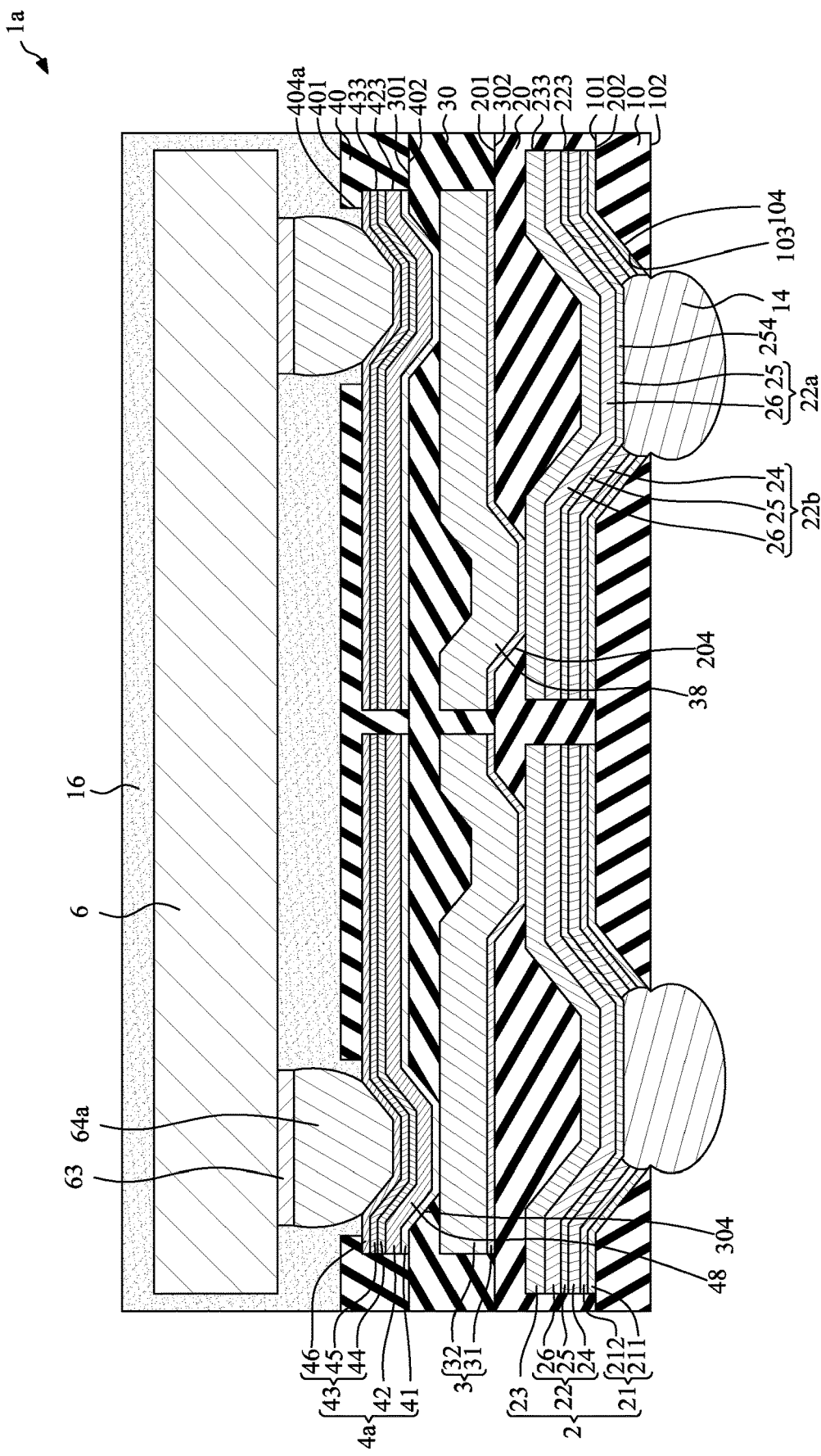
FIG. 3 illustrates a cross-sectional view of an example of an electronic device according to some embodiments of the present disclosure.

FIG. 3 illustrates a cross-sectional view of an electronic device 1a according to some embodiments of the present disclosure. The electronic device 1a is similar to the electronic device 1 shown in FIG. 1, except that the UBM 5 is omitted in the electronic device 1a, and the upper conductive structure 4 of the electronic device 1 is replaced by an upper conductive structure 4a in the electronic device 1a.

As shown in FIG. 3, the upper conductive structure 4a in the electronic device 1a includes an upper seed layer 41, an upper RDL 42 and an upper circuit structure 43 sequentially disposed on the third insulating layer 30. A material of the upper seed layer 41 may be titanium, copper, another metal or an alloy. FIG. 3 shows the upper seed layer 41 composed of only or at least primarily of one layer. However, the upper seed layer 41 may include more than one layers, or may be omitted. The upper RDL 42 is disposed on and completely covers the upper seed layer 41. The upper RDL 42 may include at least one pad and at least one trace. A material of the upper RDL 42 may include, for example, copper, another conductive metal, or an alloy thereof.

The upper circuit structure 43 includes a plurality of metal layers. The upper circuit structure 43 may contact and completely cover the upper RDL 42. For example, the upper circuit structure 43 includes a nickel layer 44, a palladium layer 45 and a gold layer 46 sequentially disposed on the upper RDL 42. The nickel layer 44 and the palladium layer 45 serve for copper barrier function, and the gold layer 6 serves for wetting function for connection with the interconnecting element 64a. The upper circuit structure 43 may be formed by plating using a same photomask and/or a same patterned photoresist as the upper RDL 42. Hence, a peripheral wall 433 of the upper circuit structure 43 may align with a peripheral wall 423 of the upper RDL 42. The upper circuit structure 43 may be conformal with the upper RDL 42. A layout of the upper circuit structure 43 may be substantially the same as a layout of upper RDL 42.

Since the UBM 5 of the electronic device 1 shown in FIG. 1 is omitted in the electronic device 1a shown in FIG. 3, the semiconductor die 6 in the electronic device 1a is electrically connected to the upper conductive structure 4a (e.g., the gold layer 46 of the upper circuit structure 43) instead of the UBM 5. For example, the fourth insulating layer 40 defines a fourth opening 404a which is located substantially corresponding to the third opening 304 of the third insulating layer 30. The fourth opening 404a of the fourth insulating layer 40 exposes a portion (e.g., the conductive via 48) of the upper conductive structure 4a, and the semiconductor die 6 is connected to the exposed portion of the upper conductive structure 4a through at least one interconnecting element 64a. The interconnecting element 64a may be formed of a solder ball, such as a solder ball made of tin.

In the electronic device 1a, since the upper circuit structure 43 is directly disposed on the upper RDL 42, a UBM layer (e.g., the UBM 5 of the electronic device 1 shown in FIG. 1) can be omitted. Thus, the formation time, manufacturing cost and the total thickness of the electronic device 1a can be further reduced. Besides, the upper circuit structure 43 and the upper RDL 42 can be formed by using a same photomask and/or a same patterned photoresist.

FIG. 4 through FIG. 28 illustrate a method for manufacturing an electronic device according to some embodiments of the present disclosure. In some embodiments, the method is for manufacturing an electronic device such as the electronic device 1 shown in FIG. 1.

Figure 4:
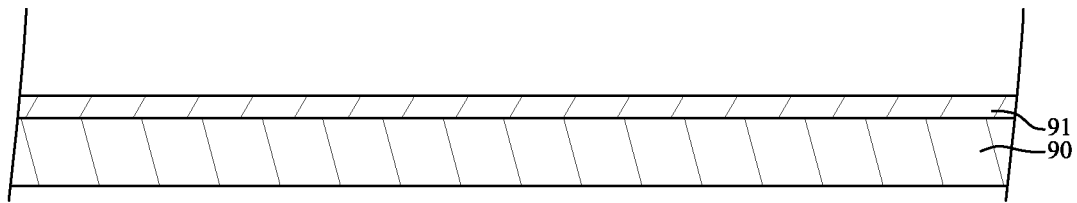
FIG. 4 illustrates one or more stages of an example of a method for manufacturing an electronic device according to some embodiments of the present disclosure.

Referring to FIG. 4, a first carrier 90 is provided. The first carrier 90 may be made of glass, and may include a release film disposed thereon. Then, a base seed layer 91 is formed on the release film of the first carrier 90 by, for example, sputtering. The base seed layer 91 may be made of copper.

Figure 5:
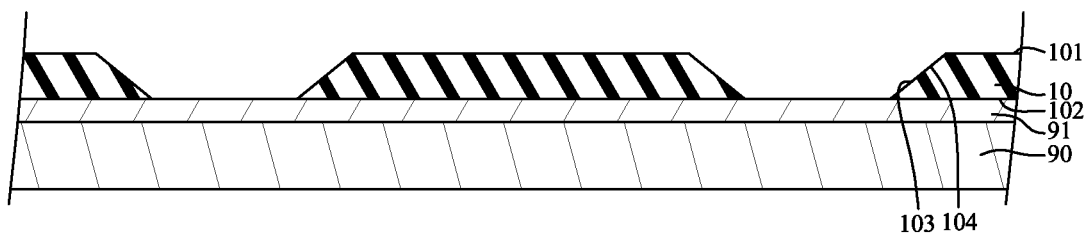
FIG. 5 illustrates one or more stages of an example of a method for manufacturing an electronic device according to some embodiments of the present disclosure.

Referring to FIG. 5, a first insulating layer 10 is formed on the base seed layer 90. The first insulating layer 10 has an upper surface 101 and a lower surface 102 opposite to the upper surface 101. A first opening 104 is formed to extend through the first insulating layer 10 and exposed portions of the base seed layer 90. The first opening 104 has a sidewall 103. A material of the first insulating layer 10 may include an insulating material, a passivation material, a dielectric material or a solder resist material, such as, for example, a benzocyclobutene (BCB) based polymer or a polyimide (PI). In some embodiments, the first insulating layer 10 may include a cured photoimageable dielectric (PID) material, such as an epoxy or a PI including photoinitiators. A thickness of the first insulating layer 10 may be about 7 µm.

Figure 6:
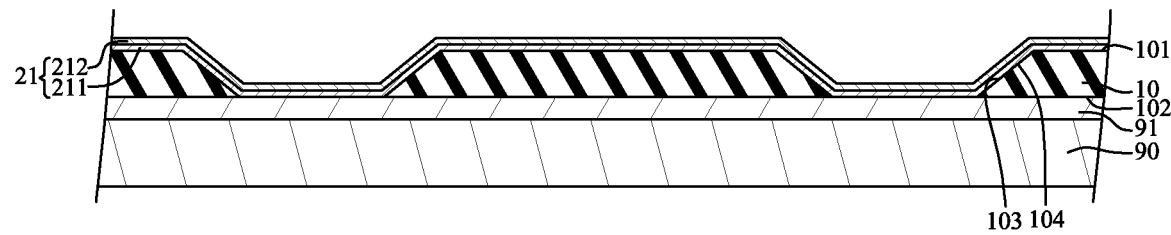
FIG. 6 illustrates one or more stages of an example of a method for manufacturing an electronic device according to some embodiments of the present disclosure.

Referring to FIG. 6, a lower seed layer 21 is formed on the upper surface 101 of the first insulating layer 10 and in the first opening 104 of the first insulating layer 10 by, for example, sputtering. A material of the lower seed layer 21 may be titanium, copper, another metal or an alloy. In some embodiments, as shown in FIG. 6, the lower seed layer 21 includes a titanium layer 211 and a copper layer 212. However, the lower seed layer 21 may include more or less layers. The titanium layer 211 is disposed on and contacts the upper surface 101 of the first insulating layer 10 and the sidewall 103 of the first opening 104 of the first insulating layer 10. The copper layer 212 is disposed on and contacts the titanium layer 211. A thickness of the titanium layer 211 may be about 0.1 µm, and a thickness of the copper layer 212 may be about 0.2 µm.

Figure 7:
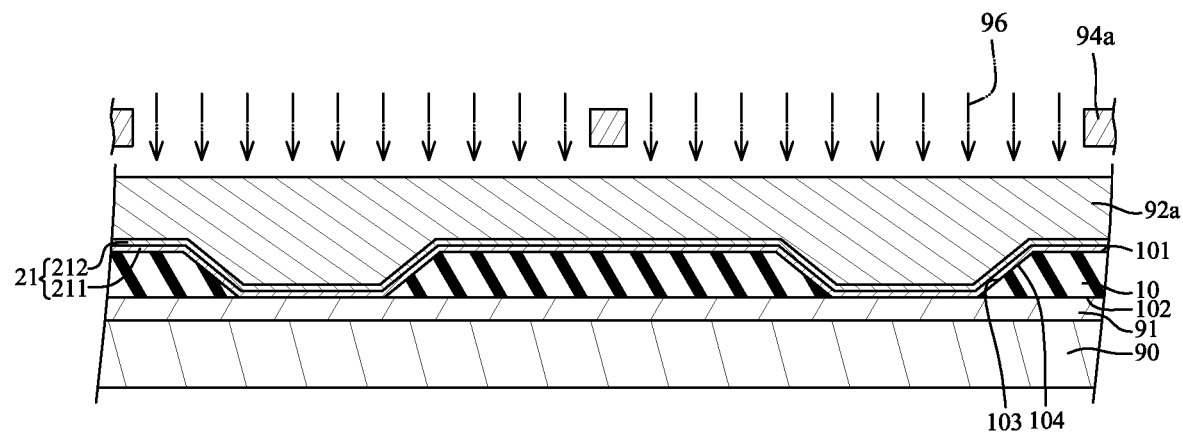
FIG. 7 illustrates one or more stages of an example of a method for manufacturing an electronic device according to some embodiments of the present disclosure.

Referring to FIG. 7, a first photoresist layer 92a is disposed on the first insulating layer 10 and the lower seed layer 21. Then, the first photoresist layer 92a is exposed to a pattern of intense light. For example, a first photomask 94a is disposed adjacent to the first photoresist layer 92a, so as to cover a portion of the first photoresist layer 92a. Then, the first photoresist layer 92a is exposed to a radiation source 96.

Figure 8:
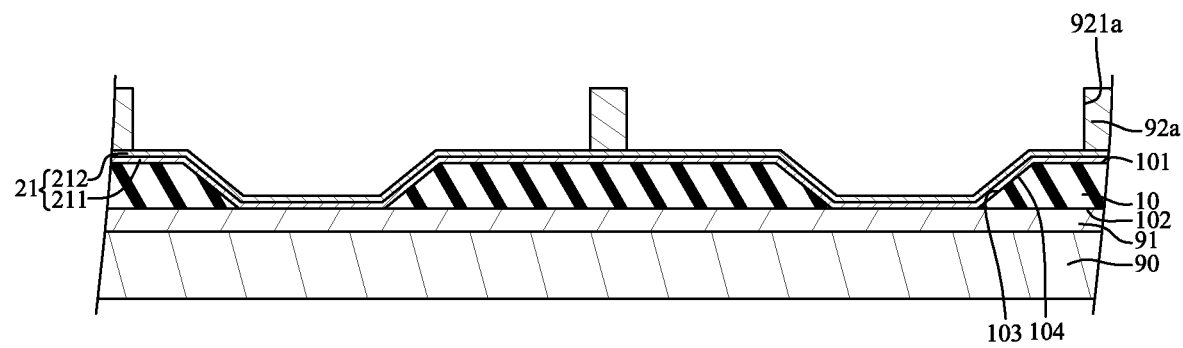
FIG. 8 illustrates one or more stages of an example of a method for manufacturing an electronic device according to some embodiments of the present disclosure.

Referring to FIG. 8, the first photoresist layer 92a is then developed by a developer. That is, the first photoresist layer 92a is patterned to define a plurality of openings 921a to expose portions of the lower seed layer 21 disposed on the upper surface 102 of the first insulating layer 10 and in the first opening 104 of the first insulating layer 10.

Figure 9:
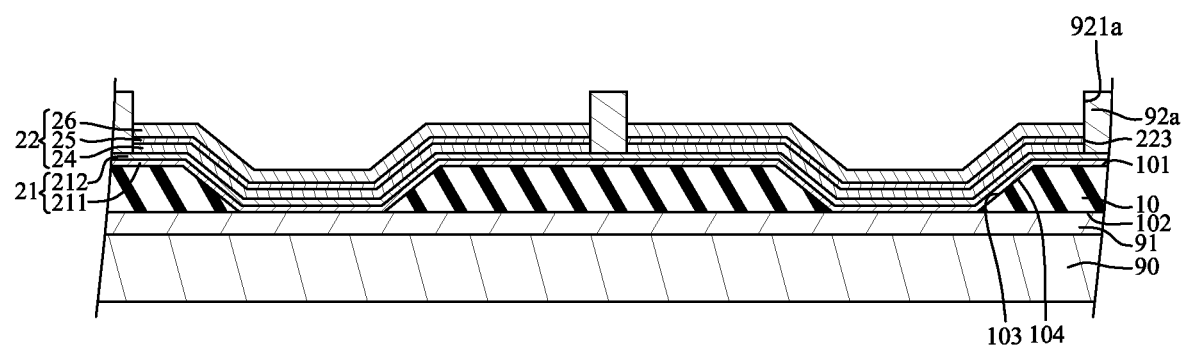
FIG. 9 illustrates one or more stages of an example of a method for manufacturing an electronic device according to some embodiments of the present disclosure.

Referring to FIG. 9, a first barrier layer 24, a wetting layer 25 and a second barrier layer 26 are sequentially formed on the lower seed layer 21 to form a lower circuit structure 22. The lower circuit structure 22 is formed in the openings 921a of the first photoresist layer 92a and on the lower seed layer 21 by, for example, plating. The lower circuit structure 22 includes a plurality of metal layers (e.g., the first barrier layer 24, the wetting layer 25 and the second barrier layer 26). The first barrier layer 24 is formed on the lower seed layer 21, and may contact the lower seed layer 21, such as the copper layer 212 of the lower seed layer 21. The wetting layer 25 is formed on the first barrier layer 24, and may contact and completely cover the first barrier layer 24. The second barrier layer 26 is formed on the wetting layer 25, and may contact and completely cover the wetting layer 25. A material of the first barrier layer 24 and the second barrier layer 26 may include nickel. A material of the wetting layer 25 may include gold. A thickness of the first barrier layer 24 may be about 1 µm, a thickness of the wetting layer 25 may be about 0.3 µm, and a thickness of the second barrier layer 26 may be about 3 µm. Since the first barrier layer 24, the wetting layer 25 and the second barrier layer 26 are formed by using the same photomask 94a and/or the same patterned photoresist 92a, a peripheral wall 223 of the lower circuit structure 22, including the first barrier layer 24, the wetting layer 25 and the second barrier layer 26, is continuous.

Figure 10:
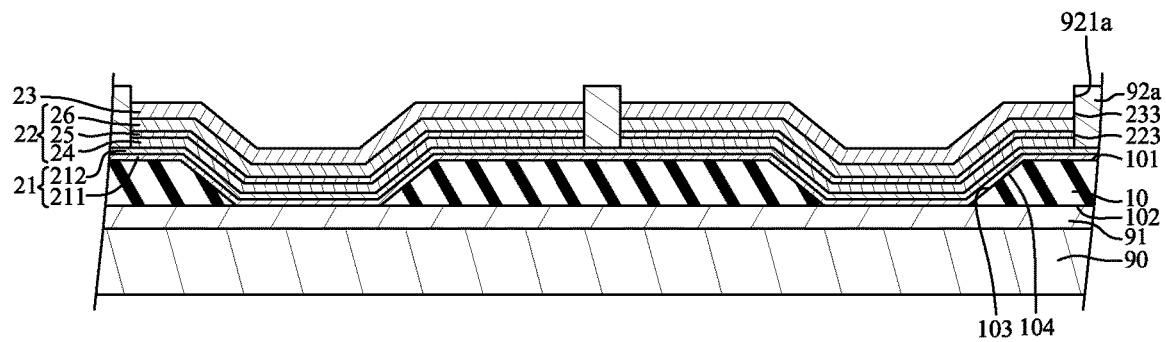
FIG. 10 illustrates one or more stages of an example of a method for manufacturing an electronic device according to some embodiments of the present disclosure.

Referring to FIG. 10, a lower RDL 23 is formed in the openings 921a of the first photoresist layer 92a and on the lower circuit structure 22 by, for example, plating. The lower RDL 23 is formed on a surface of the second barrier layer 26 of the lower circuit structure 22. The lower RDL 23 may contact and completely cover the lower circuit structure 22, such as the second barrier layer 26 of the lower circuit structure 22. The lower RDL 23 may include at least one pad and at least one trace. A material of the lower RDL 23 may include, for example, copper, another conductive metal, or an alloy thereof. A thickness of the lower RDL 23 may be about 4.3 µm.

As shown in FIGS. 9 and 10, the lower circuit structure 22 and the lower RDL 23 are formed by using the same photoresist (e.g., the first photoresist 92a). That is, the lower circuit structure 22 and the lower RDL 23 are formed by using the same photomask (e.g., the first photomask 94b). Hence, a peripheral wall 233 of the lower RDL 23 may align with the peripheral wall 223 of the lower circuit structure 22. The lower RDL 23 may be conformal with the lower circuit structure 22. A layout of the lower RDL 23 may be substantially the same as a layout of the lower circuit structure 22.

Figure 11:
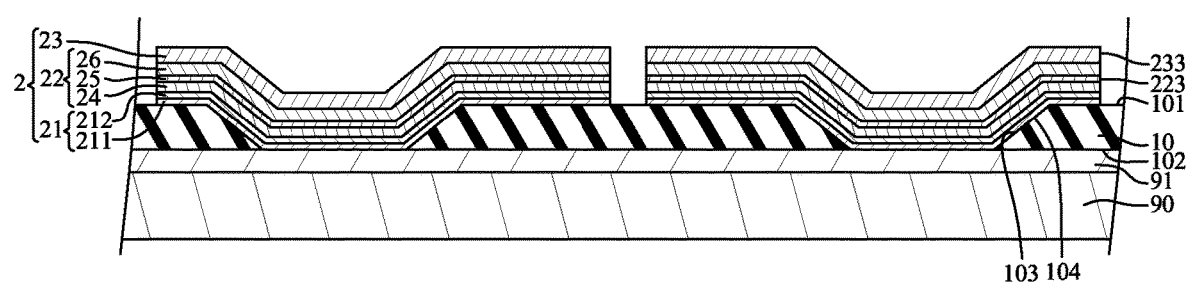
FIG. 11 illustrates one or more stages of an example of a method for manufacturing an electronic device according to some embodiments of the present disclosure.

Referring to FIG. 11, the first photoresist layer 92a is removed, and portions of the lower seed layer 21 not covered by the lower conductive structure 22 is removed by, for example, etching. Accordingly, a lower conductive structure 2 is formed and includes the lower seed layer 21, the lower circuit structure 22 and the lower RDL 23. The lower conductive structure 2 is disposed on the upper surface 101 of the first insulating layer 10 and in the first opening 104 of the first insulating layer 10. The lower seed layer 21 is interposed between the first insulating layer 10 and the lower conductive structure 22. The lower circuit structure 22, such as the first barrier layer 24 of the lower circuit structure 22, may completely cover the lower seed layer 21.

Figure 12:
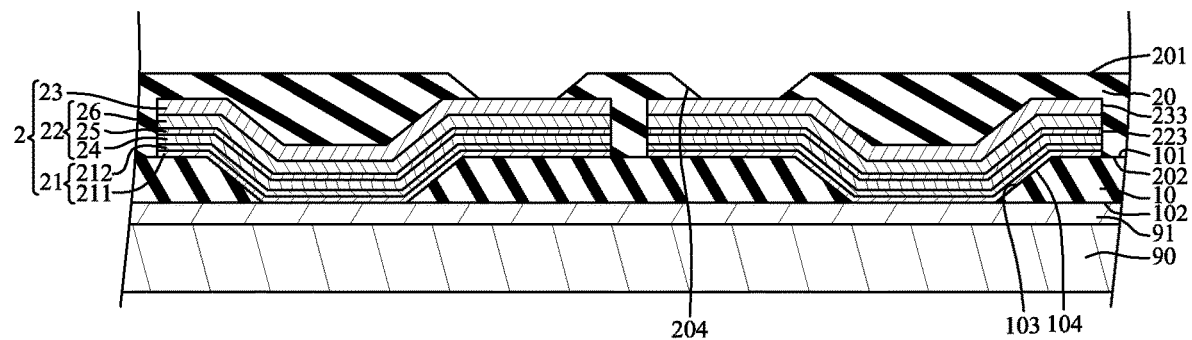
FIG. 12 illustrates one or more stages of an example of a method for manufacturing an electronic device according to some embodiments of the present disclosure.

Referring to FIG. 12, a second insulating layer 20 is formed on the first insulating layer 10. The second insulating layer 20 covers at least portions of the first insulating layer 10 and the lower conductive structure 2. As shown in FIG. 12, the second insulating layer 20 is disposed on the upper surface 101 of the first insulating layer 10. The second insulating layer 20 has an upper surface 201 and a lower surface 202 opposite to the upper surface 201. A second opening 204 is formed to extend through the second insulating layer 20 to expose a portion of the lower RDL 23. A material of the second insulating layer 20 may include an insulating material, a passivation material, a dielectric material or a solder resist material, such as, for example, a benzocyclobutene (BCB) based polymer or a polyimide (PI). In some embodiments, the second insulating layer 20 may include a cured photoimageable dielectric (PID) material, such as an epoxy or a PI including photoinitiators. A thickness of the second insulating layer 20 may be about 9 μm.

Figure 13:
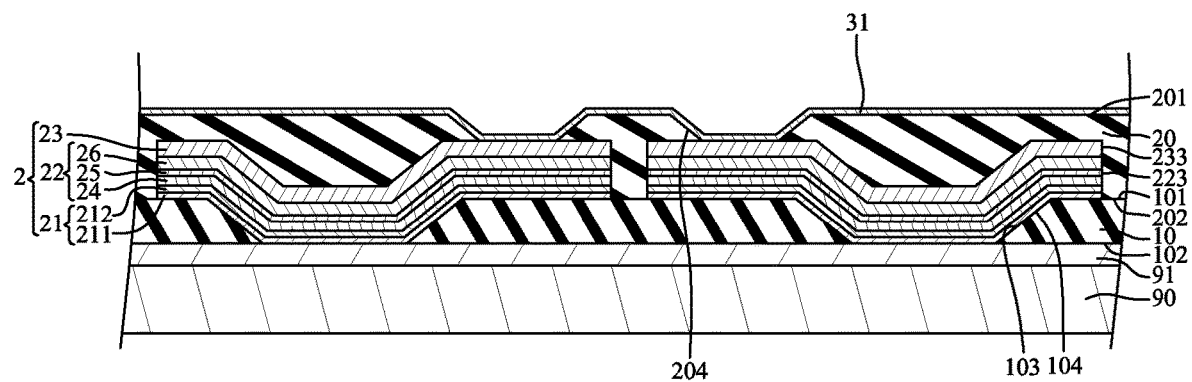
FIG. 13 illustrates one or more stages of an example of a method for manufacturing an electronic device according to some embodiments of the present disclosure.

Referring to FIG. 13, an intermediate seed layer 31 is formed on the upper surface 201 of the second insulating layer 20 and in the second opening 204 of the second insulating layer 20 by, for example, sputtering. A material of the intermediate seed layer 31 may be titanium, copper, another metal or an alloy. FIG. 13 shows the intermediate seed layer 31 composed of only or at least primarily of one layer. However, the intermediate seed layer 31 may include more than one layers.

Figure 14:
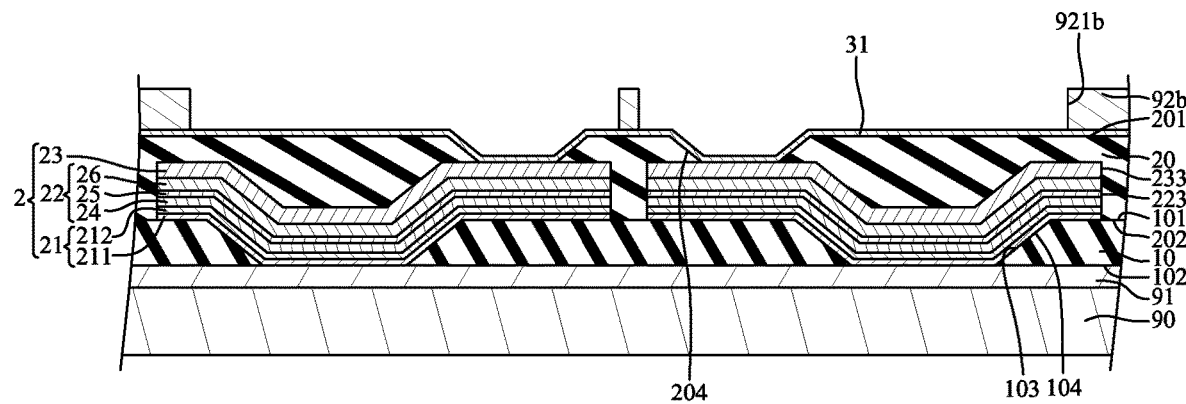
FIG. 14 illustrates one or more stages of an example of a method for manufacturing an electronic device according to some embodiments of the present disclosure.

Referring to FIG. 14, a second photoresist 92b is disposed on the second insulating layer 20 and the intermediate seed layer 31. The second photoresist layer 92b is patterned to define a plurality of openings 921b to expose portions of the intermediate seed layer 31 disposed on the upper surface 201 of the second insulating layer 20 and in the second opening 204 of the second insulating layer 20.

Figure 15:
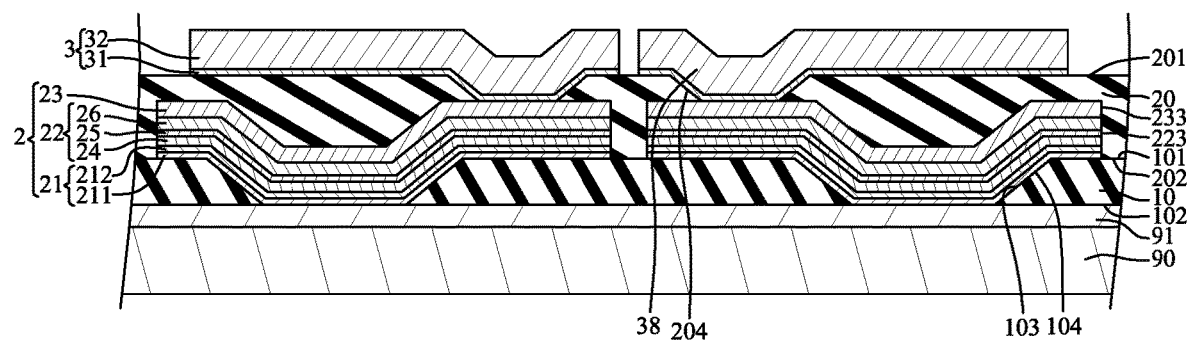
FIG. 15 illustrates one or more stages of an example of a method for manufacturing an electronic device according to some embodiments of the present disclosure.

Referring to FIG. 15, an intermediate RDL 32 is formed in the openings 921b of the second photoresist layer 92b and on the intermediate seed layer 31 by, for example, plating. The intermediate RDL 32 is disposed on the intermediate seed layer 31. The intermediate RDL 32 may include at least one pad and at least one trace. A material of the intermediate RDL 32 may include, for example, copper, another conductive metal, or an alloy thereof. A thickness of the intermediate RDL 32 may be about 8 μm. Then, the second photoresist layer 92b is removed, and portions of the intermediate seed layer 31 not covered by the intermediate RDL 32 is removed by, for example, etching. Accordingly, an intermediate conductive structure 3 is formed and includes the intermediate seed layer 31 and the intermediate RDL 32. The intermediate conductive structure 3 is disposed on the upper surface 201 of the second insulating layer 20. The intermediate conductive structure 3 extends into the second opening 204 of the second insulating layer 20 to form a conductive via 38. That is, the conductive via 38 of the intermediate conductive structure 3 extends through the second insulating layer 20. The intermediate conductive structure 3 is electrically connected to the lower conductive structure 2 through the conductive via 38.

Figure 16:
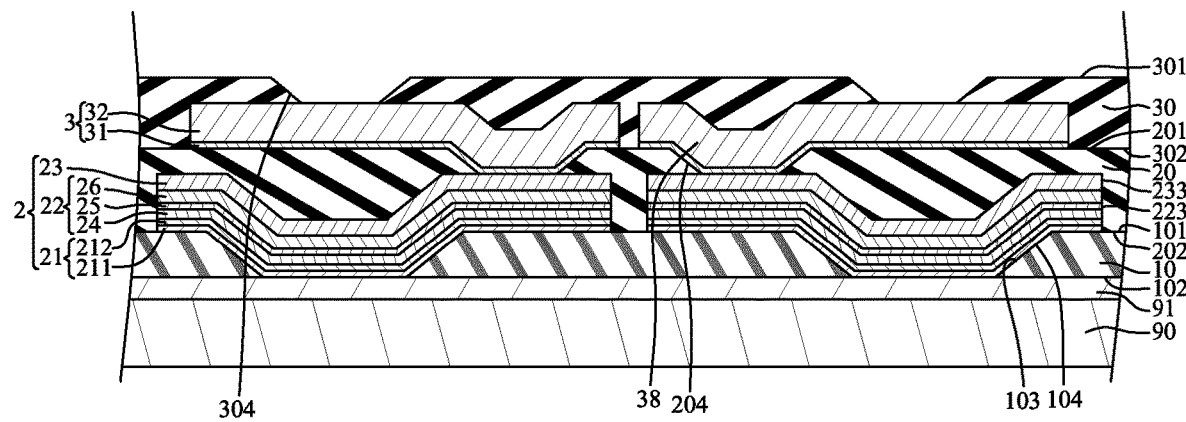
FIG. 16 illustrates one or more stages of an example of a method for manufacturing an electronic device according to some embodiments of the present disclosure.

Referring to FIG. 16, a third insulating layer 30 is formed on the second insulating layer 20. The third insulating layer 30 covers at least portions of the second insulating layer 20 and the intermediated conductive structure 3. As shown in FIG. 16, the third insulating layer 30 is disposed on the upper surface 201 of the second insulating layer 20. The third insulating layer 30 has an upper surface 301 and a lower surface 302 opposite to the upper surface 301. A third opening 304 is formed extending through the third insulating layer 30 to expose a portion of the intermediate RDL 32. A material of the third insulating layer 30 may include an insulating material, a passivation material, a dielectric material or a solder resist material, such as, for example, a benzocyclobutene (BCB) based polymer or a polyimide (PI). In some embodiments, the third insulating layer 30 may include a cured photoimageable dielectric (PID) material, such as an epoxy or a PI including photoinitiators. A thickness of the third insulating layer 30 may be about 9 μm.

Figure 17:
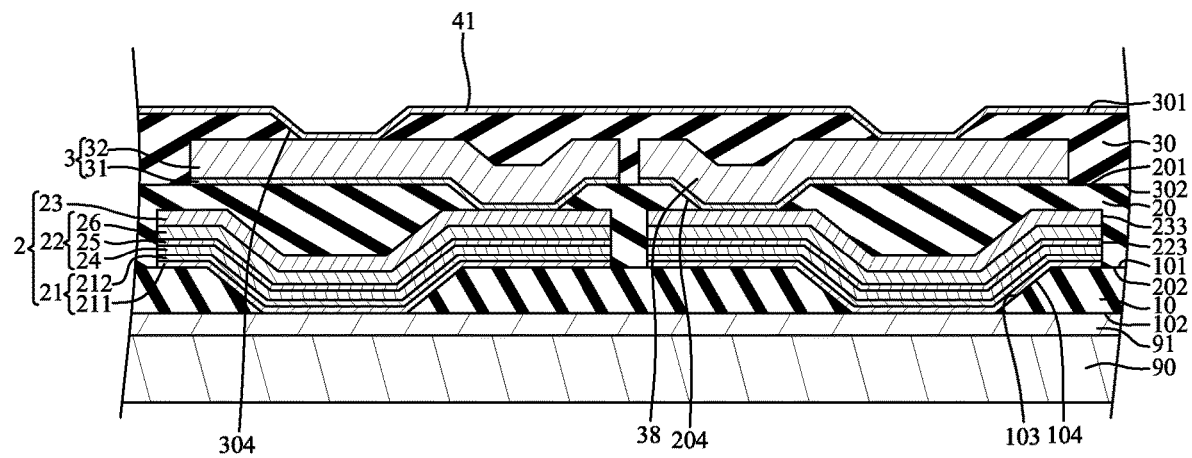
FIG. 17 illustrates one or more stages of an example of a method for manufacturing an electronic device according to some embodiments of the present disclosure.

Referring to FIG. 17, an upper seed layer 41 is formed on the upper surface 302 of the third insulating layer 30 and in the third opening 304 of the third insulating layer 30 by, for example, sputtering. A material of the upper seed layer 41 may be titanium, copper, another metal or an alloy. FIG. 17 shows the upper seed layer 41 composed of only or at least primarily of one layer. However, the upper seed layer 41 may include more than one layers.

Figure 18:
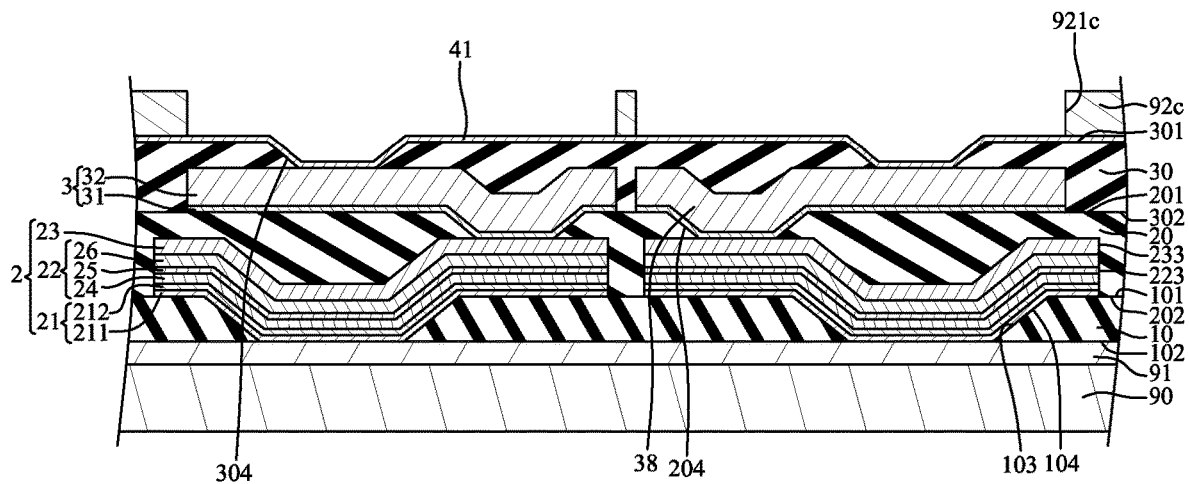
FIG. 18 illustrates one or more stages of an example of a method for manufacturing an electronic device according to some embodiments of the present disclosure.

Referring to FIG. 18, a third photoresist 92c is disposed on the third insulating layer 30. The third photoresist layer 92c is patterned to define a plurality of openings 921c to expose portions of the upper seed layer 41 disposed on the upper surface 302 of the third insulating layer 30 and in the third opening 304 of the third insulating layer 30.

Figure 19:
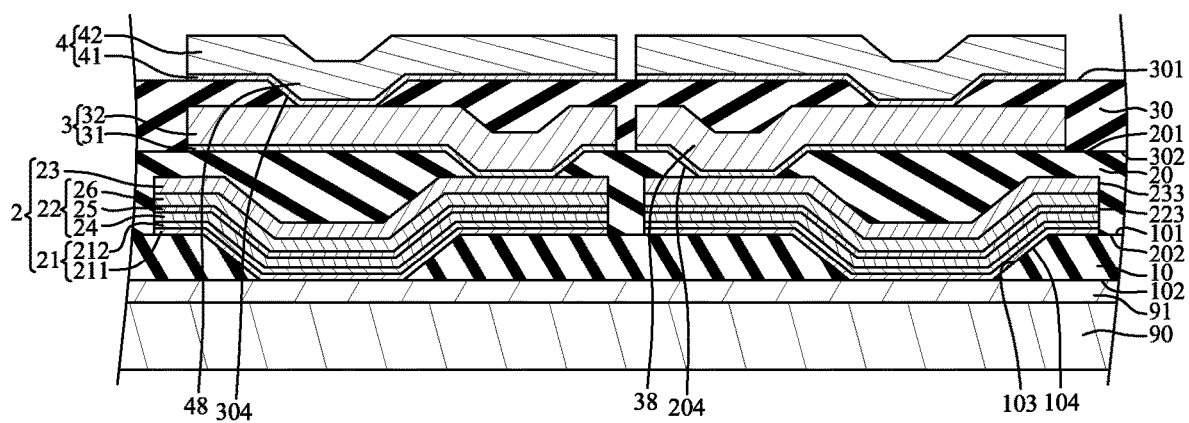
FIG. 19 illustrates one or more stages of an example of a method for manufacturing an electronic device according to some embodiments of the present disclosure.

Referring to FIG. 19, an upper RDL 42 is formed in the openings 921c of the third photoresist layer 92c and on the upper seed layer 41 by, for example, plating. The upper RDL 42 is disposed on the upper seed layer 41. The upper RDL 42 may include at least one pad and at least one trace. A material of the upper RDL 42 may include, for example, copper, another conductive metal, or an alloy thereof. A thickness of the upper RDL 42 may be about 8 μm. Then, the third photoresist layer 92c is removed, and portions of the upper seed layer 41 not covered by the intermediate RDL 42 is removed by, for example, etching. Accordingly, an upper conductive structure 4 is formed and includes the upper seed layer 41 and the upper RDL 42. The upper conductive structure 4 is disposed on the upper surface 301 of the third insulating layer 30. As shown in FIG. 19, the upper conductive structure 4 is disposed on the upper surface 301 of the third insulating layer 30. The upper conductive structure 4 extends into the third opening 304 of the third insulating layer 30 to form a conductive via 48. That is, the conductive via 48 of the upper conductive structure 4 extends through the third insulating layer 30. The upper conductive structure 4 is electrically connected to the intermediate conductive structure 3 through the conductive via 48. Hence, the upper conductive structure 4 is electrically connected to the lower conductive structure 2 through the intermediate conductive structure 3. The intermediate conductive structure 3 is disposed between the upper conductive structure 2 and the lower conductive structure 4.

Figure 20:
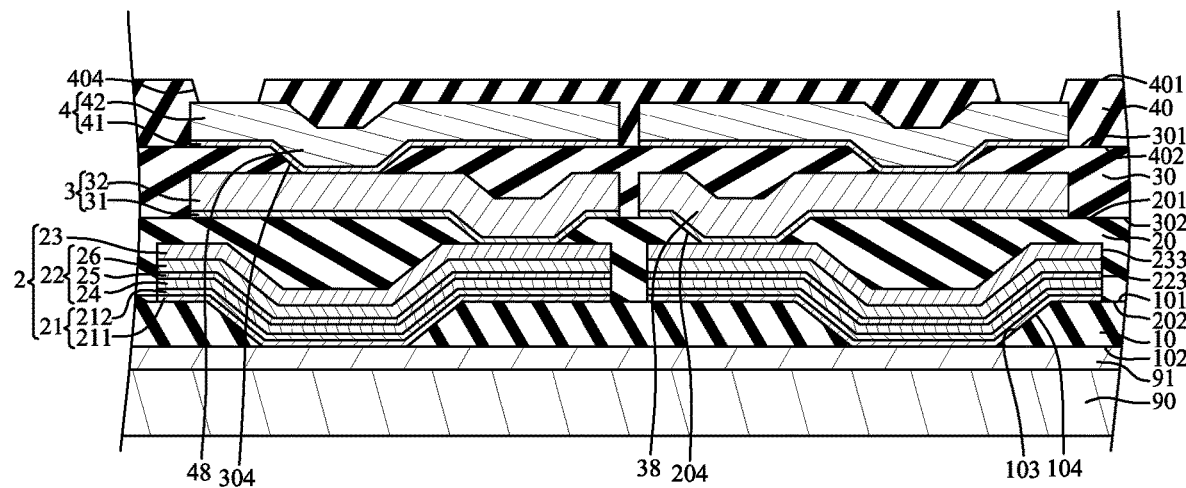
FIG. 20 illustrates one or more stages of an example of a method for manufacturing an electronic device according to some embodiments of the present disclosure.

Referring to FIG. 20, a fourth insulating layer 40 is formed on the third insulating layer 30. The fourth insulating layer 40 covers at least portions of the upper conductive structure 4. As shown in FIG. 20, the fourth insulating layer 40 is disposed on the upper surface 301 of the third insulating layer 30. The fourth insulating layer 40 has an upper surface 401 and a lower surface 402 opposite to the upper surface 401. A fourth opening 404 is formed to extend through the fourth insulating layer 40 to expose a portion of the upper RDL 42. A material of the fourth insulating layer 40 may include an insulating material, a passivation material, a dielectric material or a solder resist material, such as, for example, a benzocyclobutene (BCB) based polymer or a polyimide (PI). In some embodiments, the fourth insulating layer 40 may include a cured photoimageable dielectric (PID) material, such as an epoxy or a PI including photoinitiators. A thickness of the fourth insulating layer 40 may be about 9 µm.

Figure 21:
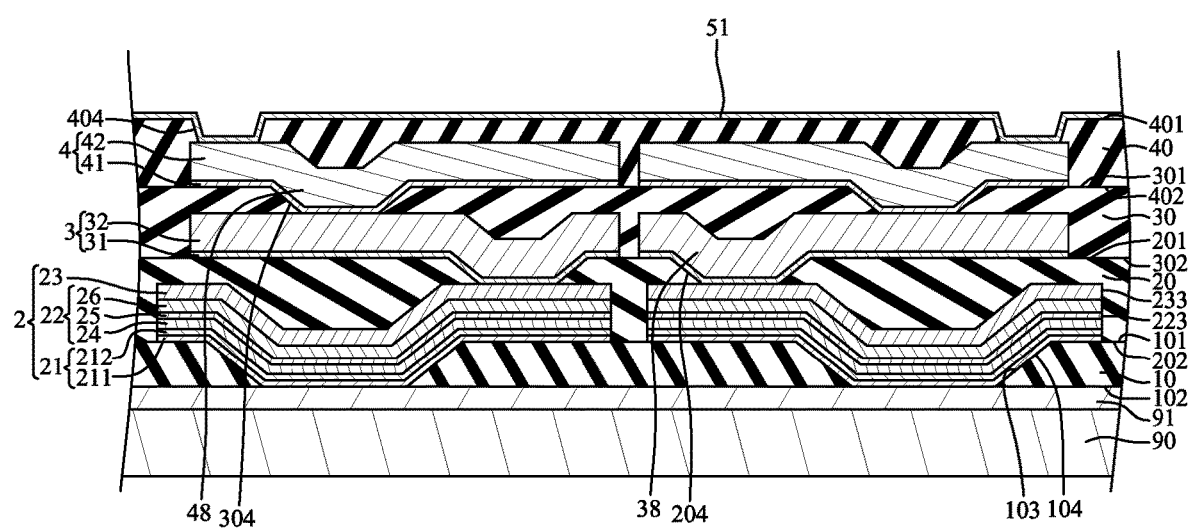
FIG. 21 illustrates one or more stages of an example of a method for manufacturing an electronic device according to some embodiments of the present disclosure.

Referring to FIG. 21, a UBM seed layer 51 is formed on the upper surface 401 of the fourth insulating layer 40 by, for example, sputtering. A material of the UBM seed layer 51 may be titanium, copper, another metal or an alloy.

Figure 22:
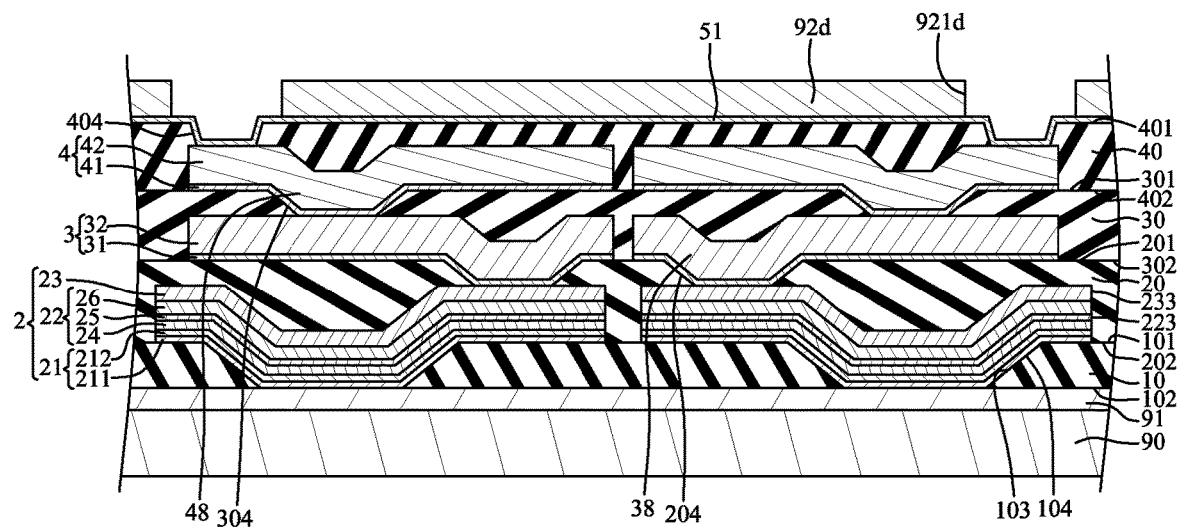
FIG. 22 illustrates one or more stages of an example of a method for manufacturing an electronic device according to some embodiments of the present disclosure.

Referring to FIG. 22, a fourth photoresist 92d is disposed on the fourth insulating layer 40. The fourth photoresist layer 92d is patterned to define a plurality of openings 921d to expose portions of the UBM seed layer 51 disposed on the upper surface 401 of the fourth insulating layer 40 and in the fourth opening 404 of the fourth insulating layer 40.

Figure 23:
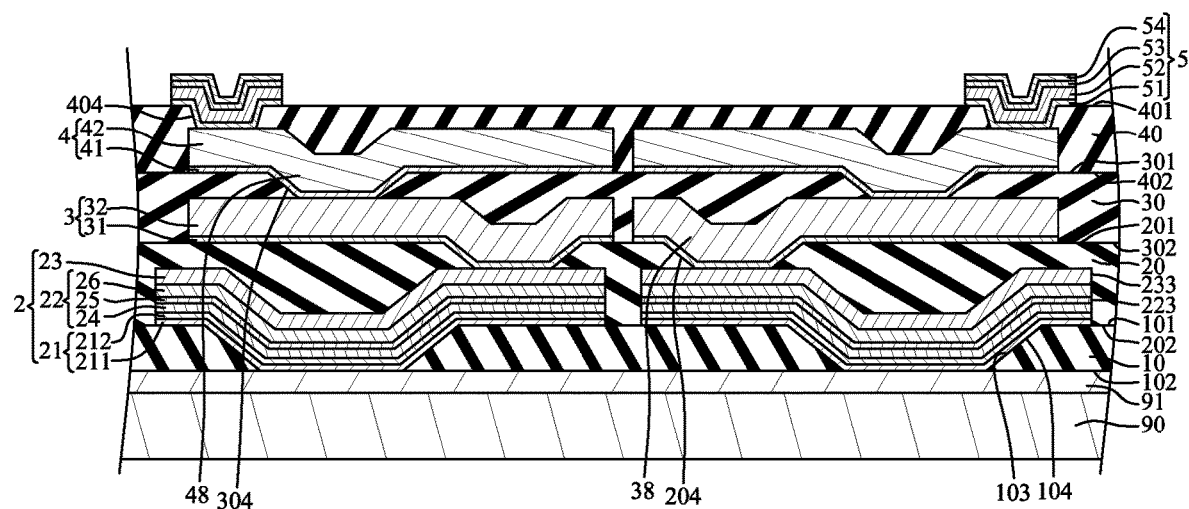
FIG. 23 illustrates one or more stages of an example of a method for manufacturing an electronic device according to some embodiments of the present disclosure.

Referring to FIG. 23, a copper layer 52, a nickel layer 53 and a gold layer 54 are sequentially formed in the openings 921d of the fourth photoresist layer 92d and on the UBM seed layer 51 by, for example, plating. Then, the fourth photoresist layer 92d is removed, and portions of the UBM seed layer 51 not covered by the copper layer 52 is removed by, for example, etching. Accordingly, a UBM 5 is formed and includes the UBM seed layer 51, the copper layer 52, the nickel layer 53 and the gold layer 54. The UBM 5 is disposed in the fourth opening 404 of the fourth insulating layer 40, and a portion of the UBM 5 may extend on the upper surface 401 of the fourth insulating layer 40.

Figure 24:
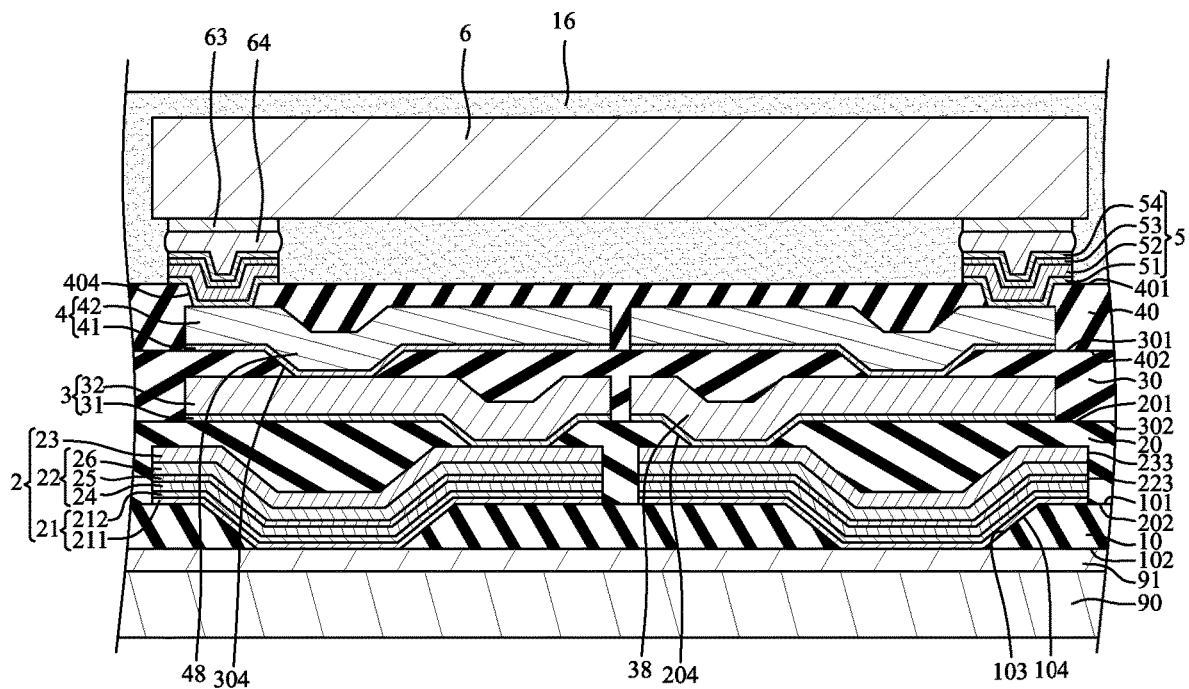
FIG. 24 illustrates one or more stages of an example of a method for manufacturing an electronic device according to some embodiments of the present disclosure.

Referring to FIG. 24, a semiconductor die 6 is connected to the UBM 5. The semiconductor die 6 is electrically connected to the upper conductive structure 4 through the UBM 5. For example, the semiconductor die 6 includes at least one bump pad 63 and at least one interconnecting element 64. The bump pad 63 is disposed on the semiconductor die 6, and the interconnecting element 64 is disposed on the UBM 5 and connected to the bump pad 63. In some embodiments, the interconnecting element 64 may be formed of a pre-solder or a solder ball. Then, an encapsulant 16 is formed on the fourth insulating layer 40 to encapsulate and cover the semiconductor die 6, the bump pad 63, the interconnecting element 64 and the UBM 5. A material of the encapsulant 16 may be a molding compound with or without fillers.

Figure 25:
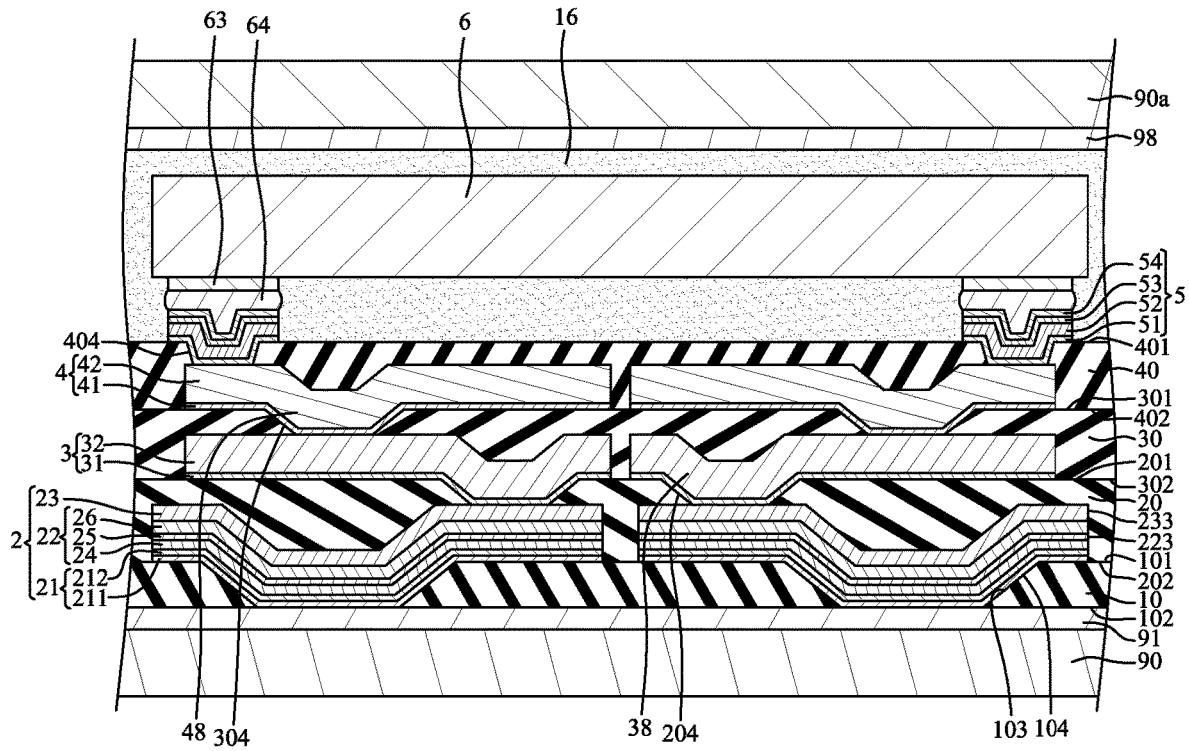
FIG. 25 illustrates one or more stages of an example of a method for manufacturing an electronic device according to some embodiments of the present disclosure.

Referring to FIG. 25, a second carrier 90a is attached to the encapsulant 16 through an adhesive layer 98. The second carrier 90a may be the same as or different from the first carrier 90.

Figure 26:
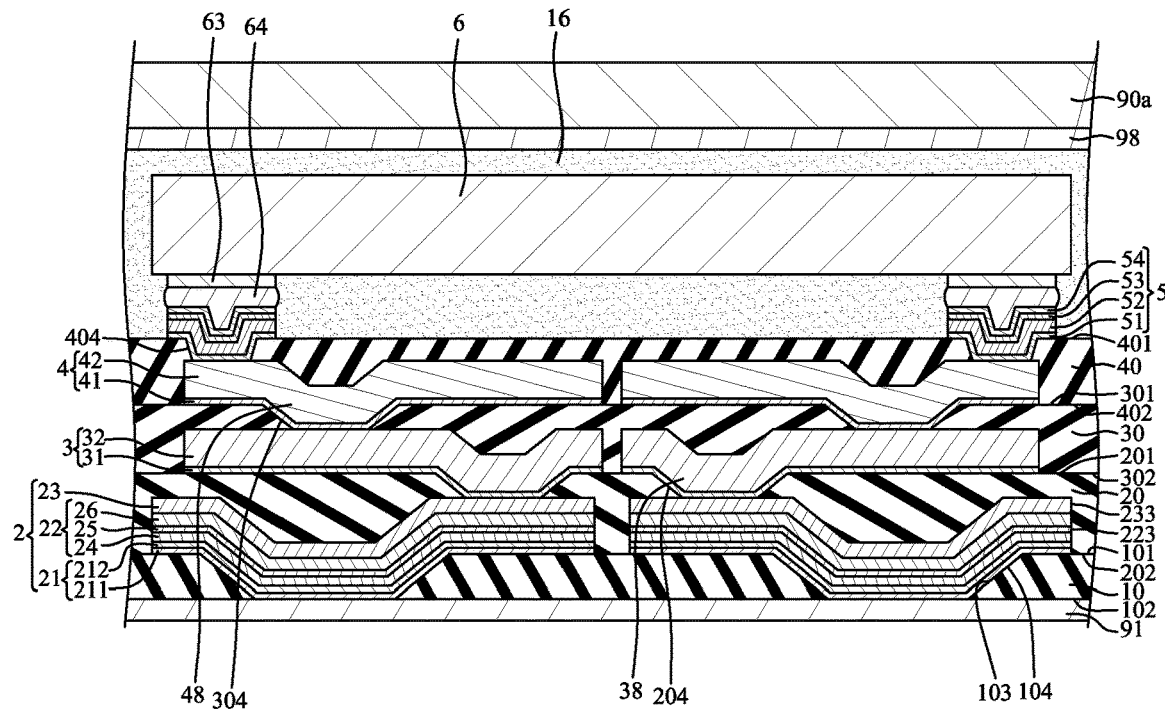
FIG. 26 illustrates one or more stages of an example of a method for manufacturing an electronic device according to some embodiments of the present disclosure.

Referring to FIG. 26, the first carrier 90 is removed, and the base seed layer 91 is exposed.

Figure 27:
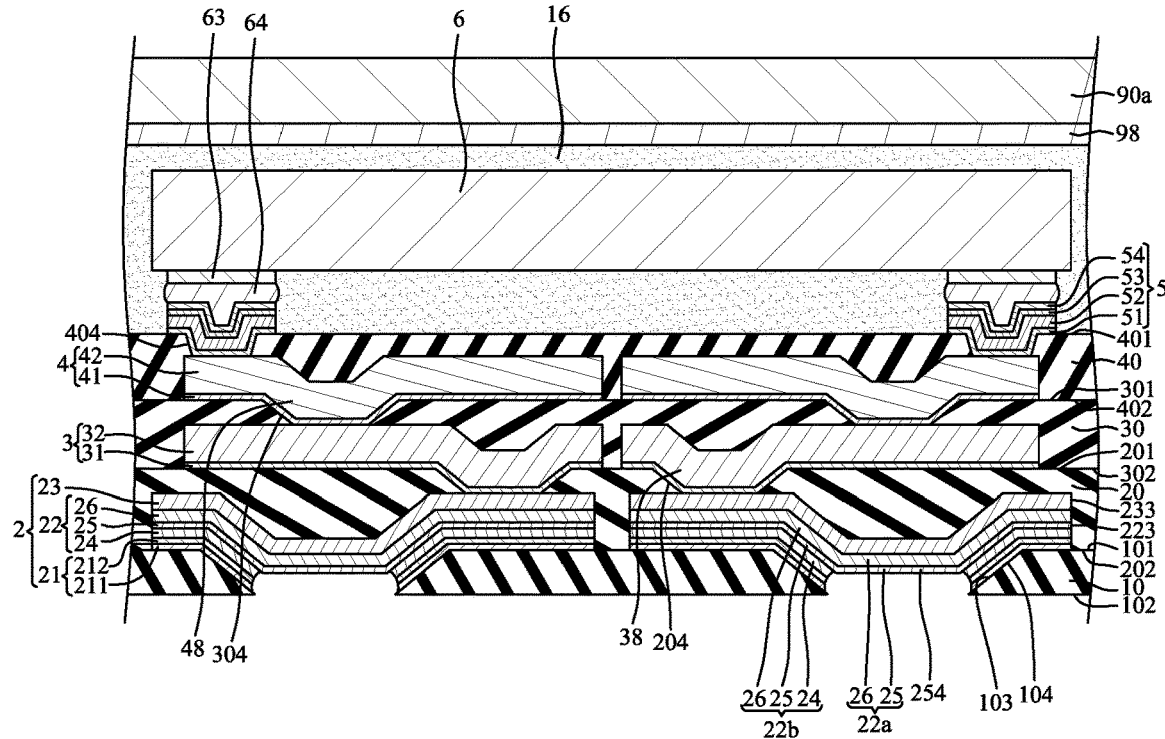
FIG. 27 illustrates one or more stages of an example of a method for manufacturing an electronic device according to some embodiments of the present disclosure.

Referring to FIG. 27, the base seed layer 91 is removed by, for example, etching. In some embodiments, portions of the first barrier layer 24 and the lower seed layer 21 adjacent to the lower surface 102 of the first insulating layer 10 are removed concurrently, forming a through hole (e.g., the through hole 240 shown in FIG. 2) extending through the first barrier layer 24 and a through hole (e.g., the through hole 210 shown in FIG. 2) extending through the lower seed layer 21. That is, a portion of the first barrier layer 24 is etched to expose a portion 254 of the wetting layer 25. Accordingly, the first barrier layer 24 is only or selectively disposed on the upper surface 101 of the first insulating layer 10 and the sidewall 103 of the first opening 104 of the first insulating layer 10, and is not exposed from the lower surface 102 of the first insulating layer 10 and the through hole 210 (FIG. 2) of the lower seed layer 21. The wetting layer 25 is disposed on the upper surface 101 of the first insulating layer 10, and in the first opening 104 of the first insulating 10. The portion 254 of the wetting layer 25 is exposed from the through hole 210 (FIG. 2) of the lower seed layer 21 and the through hole 240 (FIG. 2) of the first barrier layer 24, and from the lower surface 102 of the first insulating layer 10. The exposed portion 254 of the wetting layer 25 forms a ball pad for external connections.

The lower circuit structure 22 includes a bonding region 22a and an extending region 22b. Each layer of the lower circuit structure 22 within the bonding region 22a and within the extending region 22b may be formed concurrently and integrally as a monolithic structure. The bonding region 22a is exposed from the lower surface 102 of the first insulating layer 10 and includes the exposed portion 254 of the wetting layer 25 as the ball pad for external connections. As shown in FIG. 27, the bonding region 22a is composed of two metal layers, i.e., the wetting layer 25 and the second barrier layer 26, and is recessed from the lower surface 102 of the first insulating layer 10.

The extending region 22b is connected to and extends from the bonding region 22a. The extending region 22b is disposed on the sidewall 103 of the first opening 104 of the first insulating layer 10, and on the upper surface 101 of the first insulating layer 10. As shown in FIG. 27, the extending region 22a is composed of three metal layers, i.e., the first barrier layer 24, the wetting layer 25 and the second barrier layer 26. Accordingly, an amount of metal layers of the bonding region 22a is different from an amount of metal layers of the extending region 22b.

Figure 28:
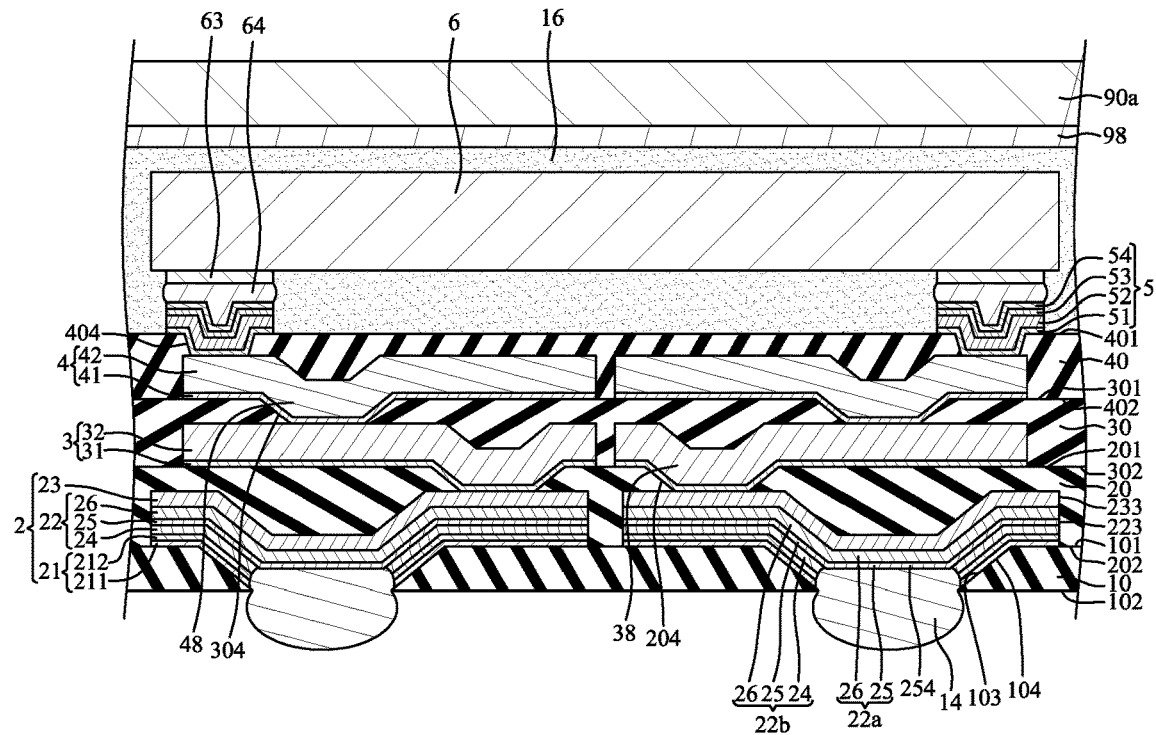
FIG. 28 illustrates one or more stages of an example of a method for manufacturing an electronic device according to some embodiments of the present disclosure.

Referring to FIG. 28, at least one electrical connecting element 14 is attached to the exposed portion 254 of the wetting layer 25 for external connections. In other words, the electrical connecting element 14 is attached to the bonding region 22a of the lower conductive structure 2. As shown in FIG. 28, the electrical connecting element 14 is attached to the ball pad formed by the exposed portion 254 of the wetting layer 25. The electrical connecting element 14 may be formed of a solder ball. In some embodiments, a maximum diameter or width of the electrical connecting element 14 may be about 80 µm, or less. Correspondingly, a size of the ball pad formed by the exposed portion 254 of the wetting layer 25 (i.e., a size of the bonding region 22a of the lower circuit structure 22) may be about 80 µm*80 µm. Then, a singulation process is conducted, and the second carrier 90a and the adhesive layer 98 are removed, forming the electronic device 1 as shown in FIG. 1. In some embodiments, the electronic device 1 may then be electrically connected to a mother board by attaching the electrical connecting element to the mother board.

Figure 29:
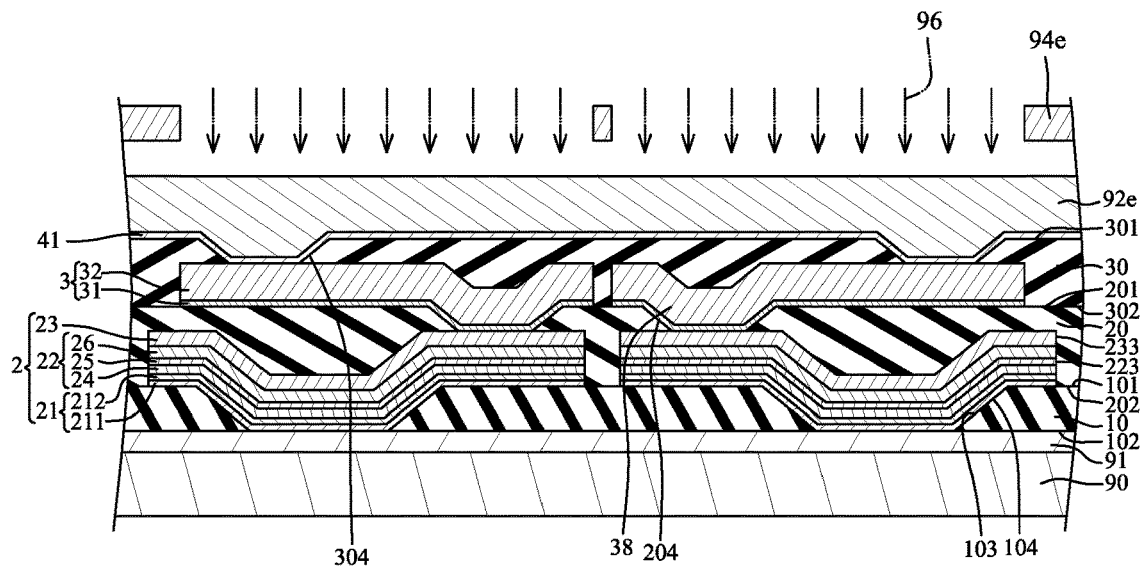
FIG. 29 illustrates one or more stages of an example of a method for manufacturing an electronic device according to some embodiments of the present disclosure.

FIG. 29 through FIG. 34 illustrate a method for manufacturing an electronic device according to some embodiments of the present disclosure. In some embodiments, the method is for manufacturing an electronic device such as the electronic device 1a shown in FIG. 3. The initial stages of the illustrated process are the same as, or similar to, the stages illustrated in FIG. 4 through FIG. 17. FIG. 29 depicts a stage subsequent to that depicted in FIG. 17.

Referring to FIG. 29, a fifth photoresist layer 92e is disposed on the third insulating layer 30 and the upper seed layer 41. Then, the fifth photoresist layer 92e is exposed to a pattern of intense light. For example, a fifth photomask 94e is disposed adjacent to the fifth photoresist layer 92e, so as to cover a portion of the fifth photoresist layer 92e. Then, the fifth photoresist layer 92e is exposed to a radiation source 96.

Figure 30:
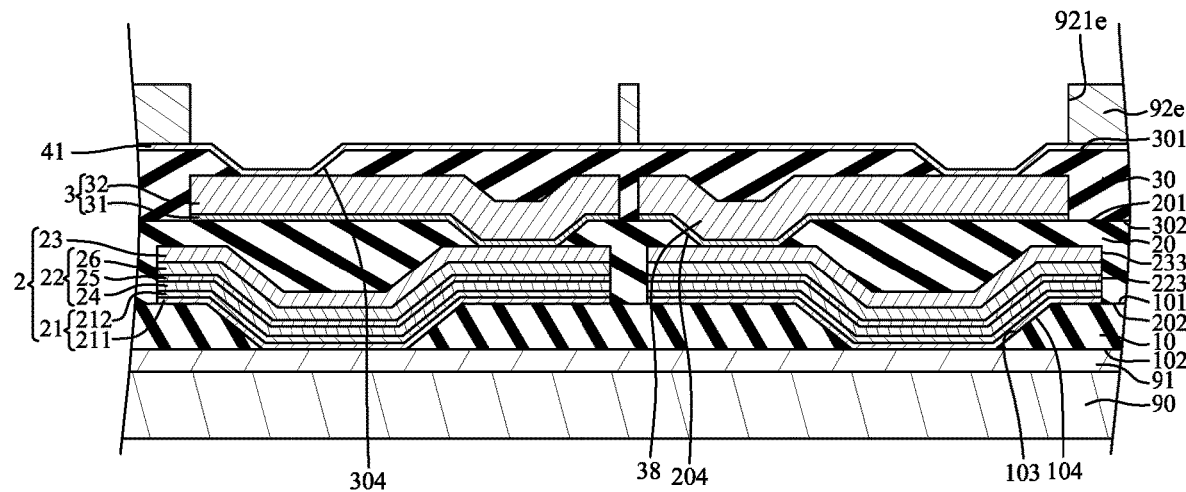
FIG. 30 illustrates one or more stages of an example of a method for manufacturing an electronic device according to some embodiments of the present disclosure.

Referring to FIG. 30, the fifth photoresist layer 92e is then developed by a developer. That is, the fifth photoresist layer 92e is patterned to define a plurality of openings 921e to expose portions of the upper seed layer 41 disposed on the upper surface 302 of the third insulating layer 30 and in the third opening 304 of the third insulating layer 30.

Figure 31:
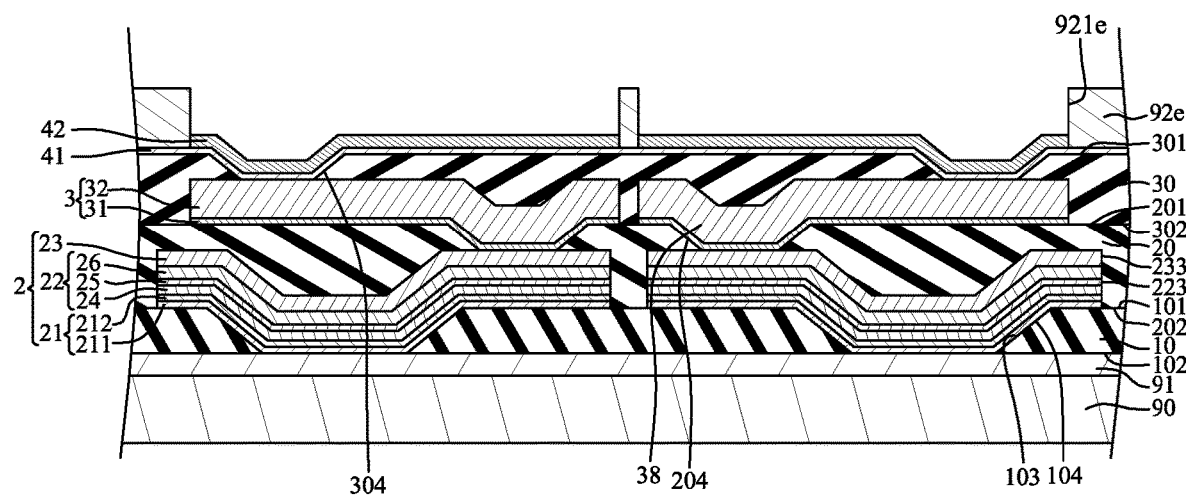
FIG. 31 illustrates one or more stages of an example of a method for manufacturing an electronic device according to some embodiments of the present disclosure.

Referring to FIG. 31, an upper RDL 42 is formed in the openings 921e of the fifth photoresist layer 92e and on the upper seed layer 41 by, for example, plating. The upper RDL 42 may include at least one pad and at least one trace. A material of the upper RDL 42 may include, for example, copper, another conductive metal, or an alloy thereof.

Figure 32:
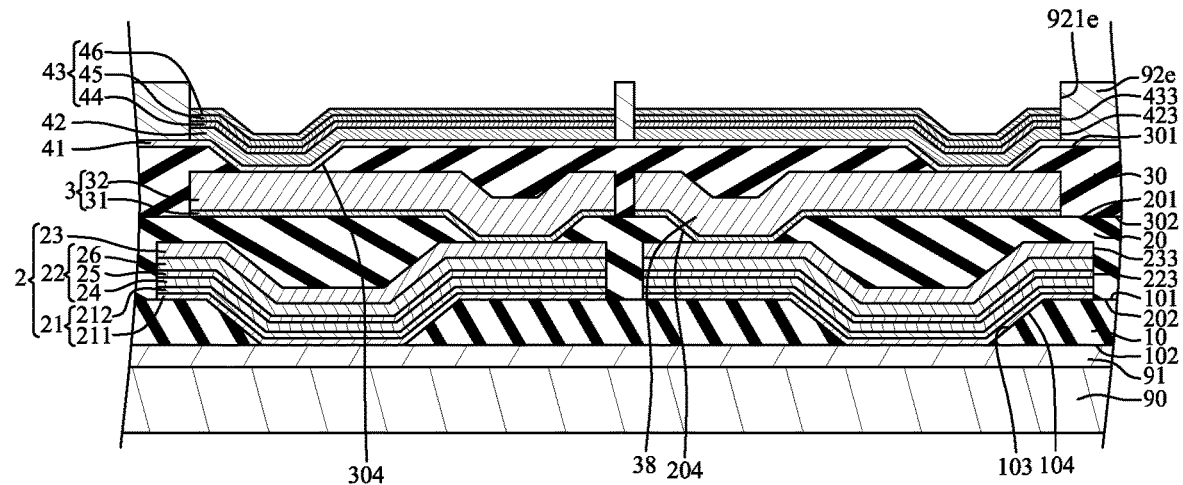
FIG. 32 illustrates one or more stages of an example of a method for manufacturing an electronic device according to some embodiments of the present disclosure.

Referring to FIG. 32, an upper circuit structure 43 is formed in the openings 921e of the fifth photoresist layer 92e and on the upper RDL 42 by, for example, plating. The upper circuit structure 43 includes a plurality of metal layers. The upper circuit structure 43 may contact and completely cover the upper RDL 42. For example, the upper circuit structure 43 includes a nickel layer 44, a palladium layer 45 and a gold layer 46 sequentially formed on the upper RDL 42. The nickel layer 44 and the palladium layer 45 serve for copper barrier function, and the gold layer 46 serves for wetting function for connection with the interconnecting element 64a (FIG. 3). As shown in FIGS. 31 ad 32, since the upper circuit structure 43 is formed by using the same photomask (e.g., the fifth photomask 94e) and/or the same patterned photoresist (e.g., the fifth photoresist 92e) as the upper RDL 42, a peripheral wall 433 of the upper circuit structure 43 aligns with a peripheral wall 423 of the upper RDL 42. The upper circuit structure 43 may be conformal with the upper RDL 42. A layout of the upper circuit structure 43 may be substantially the same as a layout of upper RDL 42.

Figure 33:
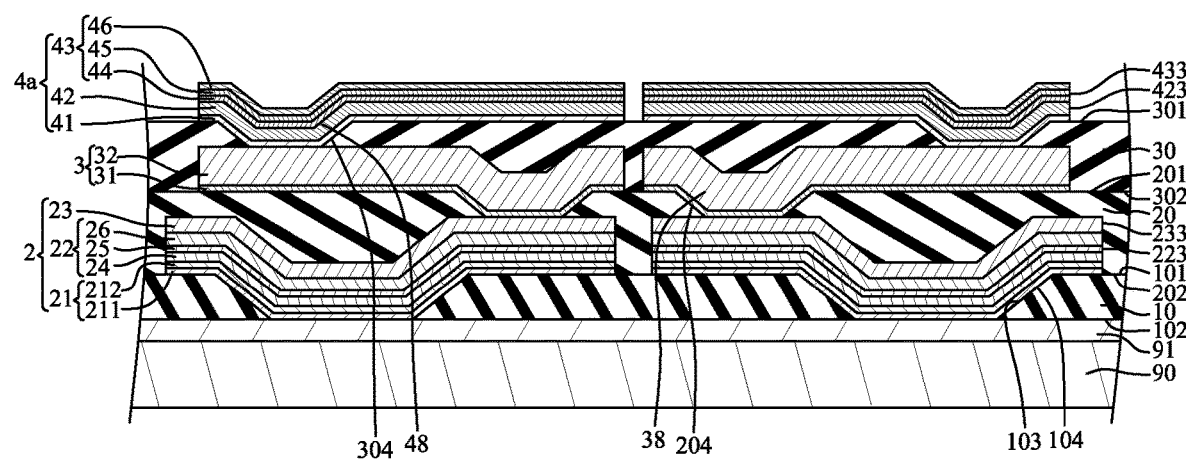
FIG. 33 illustrates one or more stages of an example of a method for manufacturing an electronic device according to some embodiments of the present disclosure.

Referring to FIG. 33, the fifth photoresist layer 92e is removed, and portions of the upper seed layer 41 not covered by the upper RDL 42 is removed by, for example, etching. Accordingly, an upper conductive structure 4a is formed and includes the upper seed layer 41, the upper RDL 42 and the upper circuit structure 43. The upper RDL 42 may completely cover the upper seed layer 41. The upper conductive structure 4 extends into the third opening 304 of the third insulating layer 30 to form a conductive via 48. That is, the conductive via 48 of the upper conductive structure 4 extends through the third insulating layer 30. The upper conductive structure 4 is electrically connected to the intermediate conductive structure 3 through the conductive via 48. Hence, the upper conductive structure 4 is electrically connected to the lower conductive structure 2 through the intermediate conductive structure 3.

Figure 34:
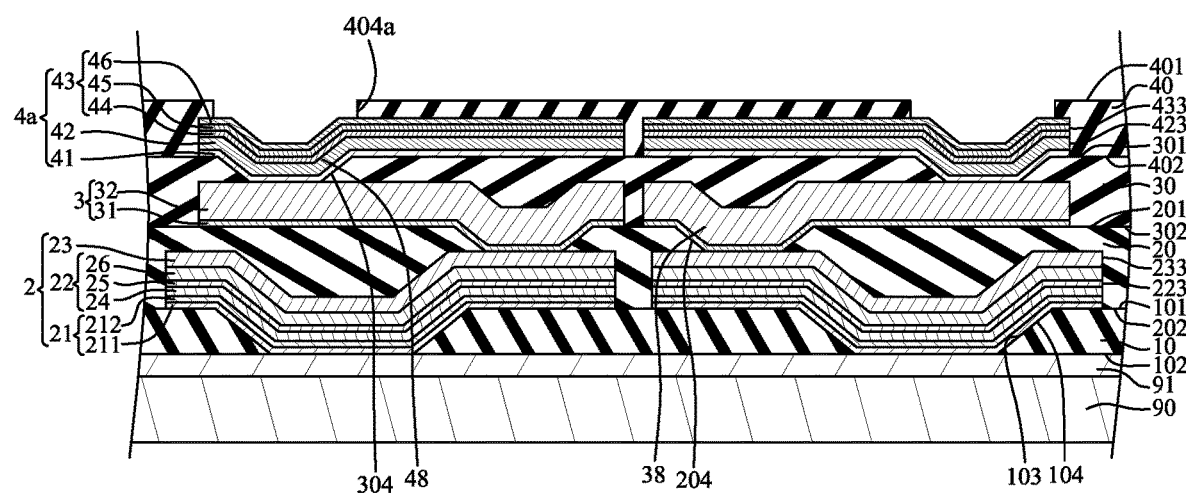
FIG. 34 illustrates one or more stages of an example of a method for manufacturing an electronic device according to some embodiments of the present disclosure.

Referring to FIG. 34, a fourth insulating layer 40 is formed on the third insulating layer 30. The fourth insulating layer 40 covers at least portions of the upper conductive structure 4a. As shown in FIG. 34, the fourth insulating layer 40 is disposed on the upper surface 301 of the third insulating layer 30. The fourth insulating layer 40 has an upper surface 401 and a lower surface 402 opposite to the upper surface 401. The fourth insulating layer 40 defines a fourth opening 404a which is located substantially corresponding to the third opening 304 of the third insulating layer 30. The fourth opening 404a of the fourth insulating layer 40 exposes a portion (e.g., the conductive via 48) of the upper conductive structure 4a. A material of the fourth insulating layer 40 may include an insulating material, a passivation material, a dielectric material or a solder resist material, such as, for example, a benzocyclobutene (BCB) based polymer or a polyimide (PI). In some embodiments, the fourth insulating layer 40 may include a cured photoimageable dielectric (PID) material, such as an epoxy or a PI including photoinitiators. A thickness of the fourth insulating layer 40 may be about 9 µm, or less.

The stages subsequent to that shown in FIG. 34 of the illustrated process are similar to the stages illustrated in FIG. 24 through FIG. 28, thus forming the electronic device 1a shown in FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a metal layer, wherein the metal layer is a seed layer, and the seed layer includes a titanium layer and a copper layer; and
   a conductive structure disposed on the metal layer and including a redistribution layer, a first barrier layer and a wetting layer, wherein the first barrier layer is disposed between the redistribution layer and the wetting layer, a first portion of the wetting layer is exposed from the metal layer to form a ball pad, and a second portion of the wetting layer is disposed on the metal layer.

2. The wiring structure of claim 1, wherein the metal layer defines a through hole extending through the metal layer, and the first portion of the wetting layer is exposed from the through hole of the metal layer to form the ball pad.

3. The wiring structure of claim 1, further comprising a second barrier layer, wherein the wetting layer is disposed between the first barrier layer and the second barrier layer.

4. The wiring structure of claim 3, wherein a thickness of the second barrier layer is less than a thickness of the first barrier layer.

5. The wiring structure of claim 3, wherein the second barrier layer is disposed on the metal layer.

6. The wiring structure of claim 3, wherein the metal layer defines a first through hole extending through the metal layer, the second barrier defines a second through hole extending through the second barrier layer, the second through hole of the second barrier layer corresponds to the first through hole of the metal layer, and the first portion of the wetting layer is exposed from the first through hole of the metal layer and the second through hole of the second barrier layer to form the ball pad.

7. The wiring structure of claim 6, wherein the ball pad is recessed from the wetting layer and the second barrier layer.

8. The wiring structure of claim 6, wherein the first through hole of the metal layer and the second through hole of the second barrier layer are disposed below the ball pad.

9. The wiring structure of claim 1, wherein a material of the wetting layer includes gold.

10. A conductive structure, comprising:
    a circuit structure including a plurality of metal layers, wherein the circuit structure includes a bonding region and an extending region, an amount of metal layers of the bonding region is different from an amount of metal layers of the extending region, the bonding region includes a wetting layer and a first barrier layer disposed on the wetting layer, the extending region includes the wetting layer, the first barrier layer and a second barrier layer, the wetting layer is disposed between the first barrier layer and the second barrier layer, and a thickness of the first barrier layer is larger than a thickness of the second barrier layer; and
    a seed layer, wherein the second barrier layer is disposed on the seed layer, and a material of the seed layer includes titanium and/or copper.

11. The conductive structure of claim 10, wherein the bonding region is uncovered by the second barrier layer.

12. The conductive structure of claim 10, further comprising a redistribution layer disposed on the first barrier layer.

13. The conductive structure of claim 12, wherein a peripheral wall of the redistribution layer aligns with a peripheral wall of the circuit structure.

14. The conductive structure of claim 10, wherein a material of the wetting layer includes gold.

15. The conductive structure of claim 10, further comprising an electronic connecting element contacting the wetting layer.

16. The conductive structure of claim 15, wherein the electronic connecting element is attached to the bonding region of the circuit structure.

* * * * *